US012764484B2

(12) United States Patent
Dehe et al.

(10) Patent No.: US 12,764,484 B2
(45) Date of Patent: Oct. 13, 2026

(54) SEMICONDUCTOR DEVICES HAVING A MEMBRANE LAYER WITH SMOOTH STRESS-RELIEVING CORRUGATIONS AND METHODS OF FABRICATION THEREOF

(71) Applicant: Infineon Technologies AG, Neubiberg (DE)

(72) Inventors: Alfons Dehe, Villingen Schwenningen (DE); Stefan Barzen, Munich (DE); Wolfgang Friza, Villach (AT); Wolfgang Klein, Zorneding (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 594 days.

(21) Appl. No.: 18/184,197

(22) Filed: Mar. 15, 2023

(65) Prior Publication Data

US 2023/0224657 A1 Jul. 13, 2023

Related U.S. Application Data

(62) Division of application No. 16/439,016, filed on Jun. 12, 2019, now abandoned, which is a division of (Continued)

(51) Int. Cl.
*H04R 31/00* (2006.01)
*B81B 3/00* (2006.01)
(Continued)

(52) U.S. Cl.
CPC ........... *H04R 31/003* (2013.01); *B81B 3/001* (2013.01); *B81B 3/0072* (2013.01);
(Continued)

(58) Field of Classification Search
CPC .................. B81B 3/001; B81B 3/0072; B81B 2201/0257; B81C 1/00158;
(Continued)

(56) References Cited

U.S. PATENT DOCUMENTS

| | | | |
|---|---|---|---|
| 5,501,893 | A | 3/1996 | Laermer et al. |
| 6,128,961 | A | 10/2000 | Haronian |

(Continued)

FOREIGN PATENT DOCUMENTS

| | | | |
|---|---|---|---|
| CN | 101123827 | A | 2/2008 |
| CN | 101465628 | A | 6/2009 |

(Continued)

OTHER PUBLICATIONS

Jing, Chen et al., "Dynamic Characteristics of Novel Single-Chip Fabricated Corrugated Diaphragms for Micro-Acoustic Devices," 6th International Conference on Solid-State and Integrated Circuit Technology, Proceedings (Cat. No. .01EX443), China, Oct. 22-25, 2001, pp. 757-760, vol. 2, doi: 10.1109/ICSICT.2001.9820.

(Continued)

*Primary Examiner* — Marcos D. Pizarro
(74) *Attorney, Agent, or Firm* — Slater Matsil, LLP

(57) ABSTRACT

In one embodiment, a method of manufacturing a semiconductor device includes oxidizing a substrate to form local oxide regions that extend above a top surface of the substrate. A membrane layer is formed over the local oxide regions and the top surface of the substrate. A portion of the substrate under the membrane layer is removed. The local oxide regions under the membrane layer are removed.

20 Claims, 26 Drawing Sheets

Related U.S. Application Data application No. 14/611,953, filed on Feb. 2, 2015, now Pat. No. 10,405,118, which is a division of application No. 13/162,088, filed on Jun. 16, 2011, now Pat. No. 8,975,107.

(51) Int. Cl.

| | |
|---|---|
| ***B81C 1/00*** | (2006.01) |
| ***H04R 7/14*** | (2006.01) |
| ***H04R 19/00*** | (2006.01) |
| ***H04R 19/04*** | (2006.01) |

(52) U.S. Cl.

CPC ...... *B81C 1/00158* (2013.01); *B81C 1/00182* (2013.01); *B81C 1/00666* (2013.01); *H04R 7/14* (2013.01); *H04R 19/005* (2013.01); *H04R 19/04* (2013.01); *B81B 2201/0257* (2013.01)

(58) Field of Classification Search

CPC ..... B81C 1/00182; B81C 1/0066; H04R 7/14; H04R 19/005; H04R 19/04; H04R 31/003

See application file for complete search history.

(56) References Cited

U.S. PATENT DOCUMENTS

| | | | | |
|---|---|---|---|---|
| 6,284,670 | B1 * | 9/2001 | Abe | H01L 21/3063 257/E21.216 |
| 7,568,394 | B1 | 8/2009 | Keilman et al. | |
| 7,912,236 | B2 | 3/2011 | Dehe et al. | |
| 2003/0133588 | A1 | 7/2003 | Pedersen | |
| 2004/0253760 | A1 | 12/2004 | Zhang et al. | |
| 2005/0241944 | A1 | 11/2005 | Dehe et al. | |
| 2006/0210106 | A1 | 9/2006 | Pedersen | |
| 2007/0291964 | A1 | 12/2007 | Chien et al. | |
| 2008/0075308 | A1 | 3/2008 | Wei et al. | |
| 2008/0104825 | A1 * | 5/2008 | Dehe | H04R 31/00 381/152 |
| 2008/0121611 | A1 | 5/2008 | Miller et al. | |
| 2009/0016550 | A1 | 1/2009 | Qiao | |
| 2009/0116675 | A1 * | 5/2009 | Miyoshi | H04R 19/005 73/514.32 |
| 2009/0205432 | A1 | 8/2009 | Keilman et al. | |
| 2009/0270740 | A1 | 10/2009 | Keilman et al. | |
| 2010/0084721 | A1 | 4/2010 | Wu et al. | |
| 2010/0090298 | A1 | 4/2010 | Shih et al. | |
| 2010/0212432 | A1 | 8/2010 | Kasai et al. | |
| 2011/0006382 | A1 | 1/2011 | Nakatani | |
| 2011/0215672 | A1 | 9/2011 | Yamaoka et al. | |
| 2012/0025337 | A1 | 2/2012 | LeCLair et al. | |
| 2012/0161257 | A1 | 6/2012 | Friza et al. | |

FOREIGN PATENT DOCUMENTS

| | | | |
|---|---|---|---|
| CN | 101588529 | A | 11/2009 |
| CN | 102066239 | A1 | 5/2011 |
| DE | 102004050764 | A1 | 4/2006 |
| TW | 200722365 | A | 6/2007 |
| WO | 2010079574 | A1 | 6/2012 |

OTHER PUBLICATIONS

Yoo, Kyutae et al., “Fabrication of a Biomimetic Corrugated Polysilicon Diaphragm With Attached Single Crystal Silicon Proof Masses”, Transducers-01 Eurosensors XV, The 11th International Conference on Solid-State Sensors and Actuators, Munich, Germany, Jun. 10-14, 2001, p. 130-133.

Zou, Q., et al., “Design and Fabriction of Silicon Condenser Microphone Using Corrugated Diaphragm Technique,” Journal of Microelectromechanical Systems, vol. 5, No. 3, Sep. 1996, pp. 197-204.

Yoo, K., et al., “Fabrication of biomimetic 3-D structured diaphrams”, Elsevier, Sensors and Actuators A, 97-98, NY, USA, Apr. 1, 2002, 10 pages.

* cited by examiner

| | 1 BAR PRESSURE FROM BOTTOM | | 1 BAR PRESSURE FROM TOP | |
|---|---|---|---|---|
| | Max. stress (GPa) | Max.defl. (μm) | Max. stress (GPa) | Max.defl. (μm) |
| SHARP EDGE | 7.5 | 34 | 7.9 | 34 |
| SMOOTH EDGE | 4.8 | 33 | 2.3 | 33 |
*FIG. 5*
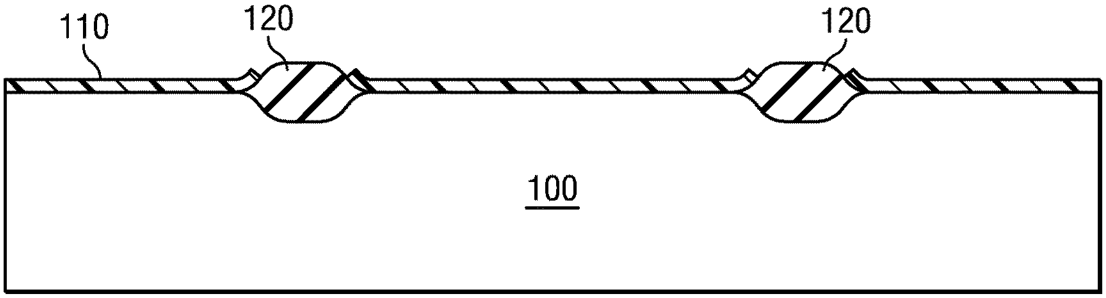
*FIG. 6A*
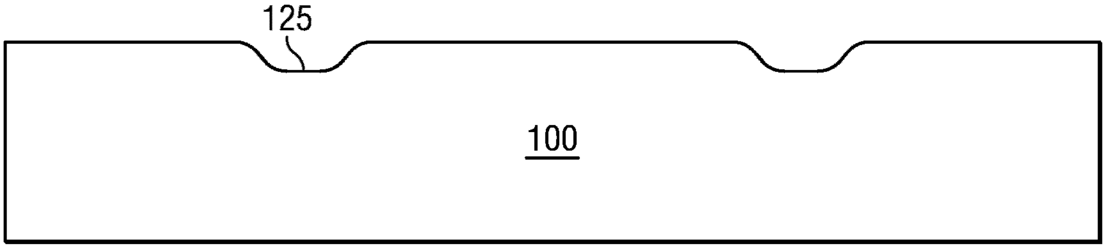
*FIG. 6B*
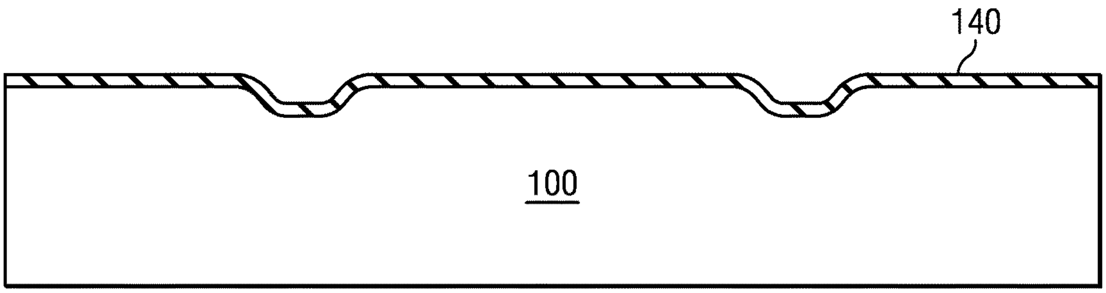
*FIG. 6C*
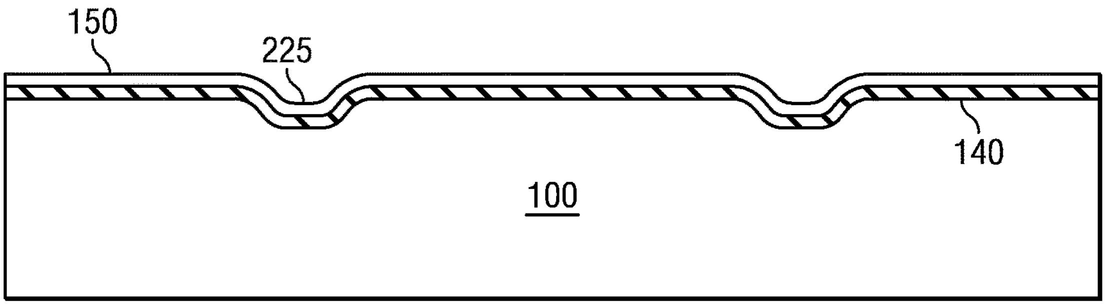
*FIG. 6D*

SEMICONDUCTOR DEVICES HAVING A MEMBRANE LAYER WITH SMOOTH STRESS-RELIEVING CORRUGATIONS AND METHODS OF FABRICATION THEREOF

This application is a divisional of U.S. patent application Ser. No. 16/439,016, filed on Jun. 12, 2019, which application is a divisional of U.S. patent application Ser. No. 14/611,953, filed on Feb. 2, 2015, now U.S. Pat. No. 10,405,118, issued on Sep. 3, 2019, which application is a divisional application of Ser. No. 13/162,088 filed on Jun. 16, 2011, now U.S. Pat. No. 8,975,107, issued on Mar. 10, 2015, which applications are incorporated herein by reference.

TECHNICAL FIELD

The present invention relates generally to micro-electromechanical systems devices, and more particularly, to semiconductor devices and methods of fabrications thereof.

BACKGROUND

Small electromechanical components can be manufactured using micro-electromechanical systems (MEMS) technology using microelectronics manufacturing processes. MEMS devices include thin membranes and beams, which function as mechanical and/or electrical components.

Silicon microphones are a type of MEMS device in which the MEMS structure or a membrane actuates with acoustic signals. However, the sensitivity of the membrane, and therefore, the MEMS device varies with stress in the membrane. For example, tensile stress severely decreases the mechanical compliance of the microphone.

Stress may be residual, which is formed during the fabrication, or may build up during operation. Therefore, MEMS devices and methods which minimize film stress are needed.

SUMMARY OF THE INVENTION

These and other problems are generally solved or circumvented, and technical advantages are generally achieved, by illustrative embodiments of the present invention.

In accordance with an embodiment of the invention, a method of manufacturing a semiconductor device comprises oxidizing a substrate to form local oxide regions extending above a top surface of the substrate, and forming a membrane layer over the local oxide regions and the top surface of the substrate. The method further comprises removing a portion of the substrate under the membrane layer, and removing the local oxide regions under the membrane layer.

In accordance with an embodiment of the invention, method of manufacturing a semiconductor device comprises forming a plurality of features in a substrate, and forming a membrane layer over the substrate comprising the plurality of features. The method further comprises removing a portion of the substrate under the membrane layer.

In accordance with an embodiment of the invention, a semiconductor device comprises a membrane layer comprising a plurality of corrugations disposed over a substrate. Each corrugation of the plurality of corrugations has a sidewall and a bottom surface. A radius of curvature of an edge connecting the sidewall and the bottom surface is greater than a thickness of the membrane layer. A radius of curvature of an edge connecting the sidewall and the top surface is greater than the thickness of the membrane layer.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A and 1B, illustrates a MEMS device in accordance with an embodiment of the invention, wherein FIG. 1A illustrates a cross sectional view and FIG. 1B illustrates a top view;

FIG. 4, which includes FIGS. 4A and 4B, illustrates lateral stress along the membrane layer for two different configurations of the corrugation, wherein FIG. 4A illustrates the stress for a corrugation with sharp edges, and wherein FIG. 4B illustrates the stress for a corrugation with smooth edges as described herein in various embodiments;

FIG. 5 illustrates a table summarizing the simulation results of FIG. 4;

FIG. 6, which includes FIG. 6A-6D, illustrates a MEMS device with a membrane layer having negative corrugations during various stages of fabrication, in accordance with an embodiment of the invention;

FIG. 7, which includes

FIG. 8, which includes

FIG. 9, which includes

FIG. 10, which includes

FIG. 11, which includes FIGS. 11A and 11B, illustrates a MEMS device having a circular membrane in accordance with an embodiment of the invention, wherein FIG. 11A illustrates a top view and FIG. 11B illustrates a cross-sectional view;

FIG. 12, which includes FIGS. 12A and 12B, illustrates a MEMS device having a spring supported membrane in accordance with an embodiment of the invention, wherein FIG. 12A illustrates a top view and FIG. 12B illustrates a cross-sectional view.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely a Micro electro-mechanical systems (MEMS) sensor. The invention may also be applied, however, to other types of semiconductor devices.

A structural embodiment of a MEMS sensor will be described using FIG. 1. Further structural embodiments will be described using FIGS. 3-5, it A method of fabricating the MEMS sensor will be described using FIG. 2. Further methods of fabricating the MEMS sensor will be described using FIGS. 6-10.

Figure 1A:
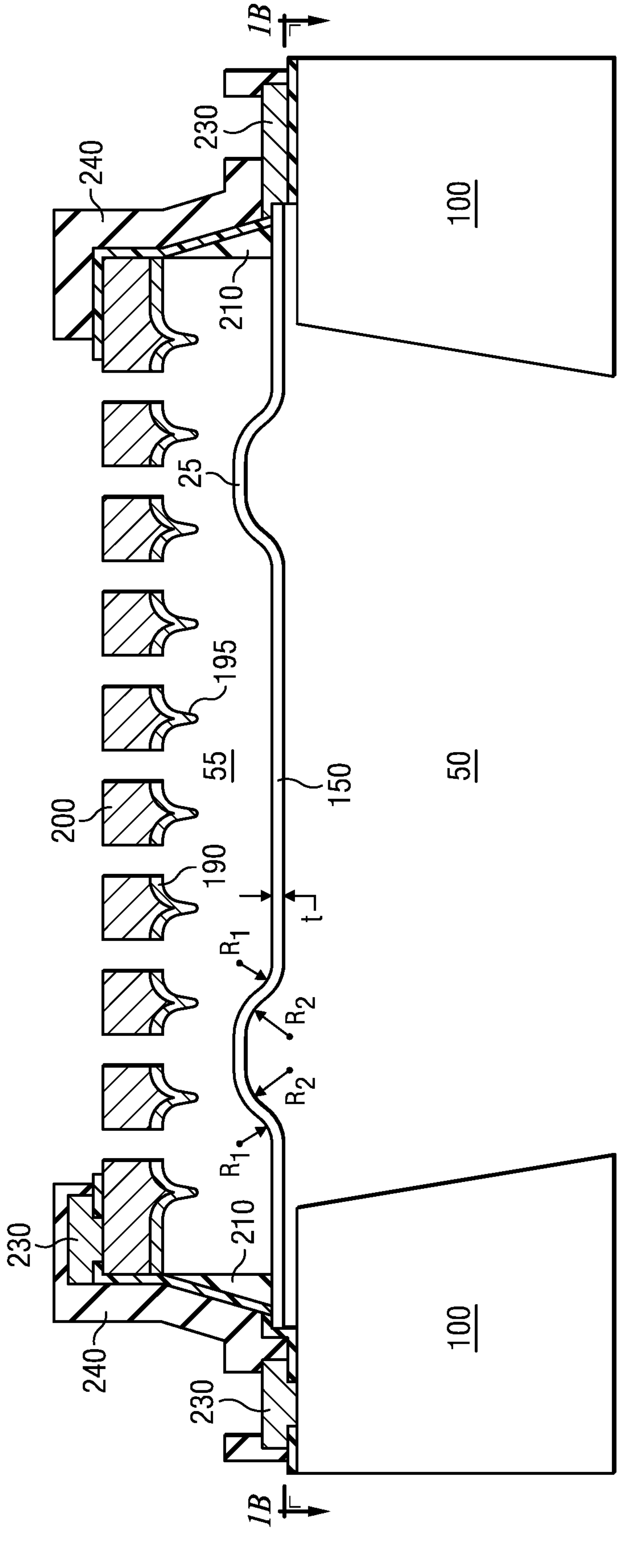
Figure 1B:
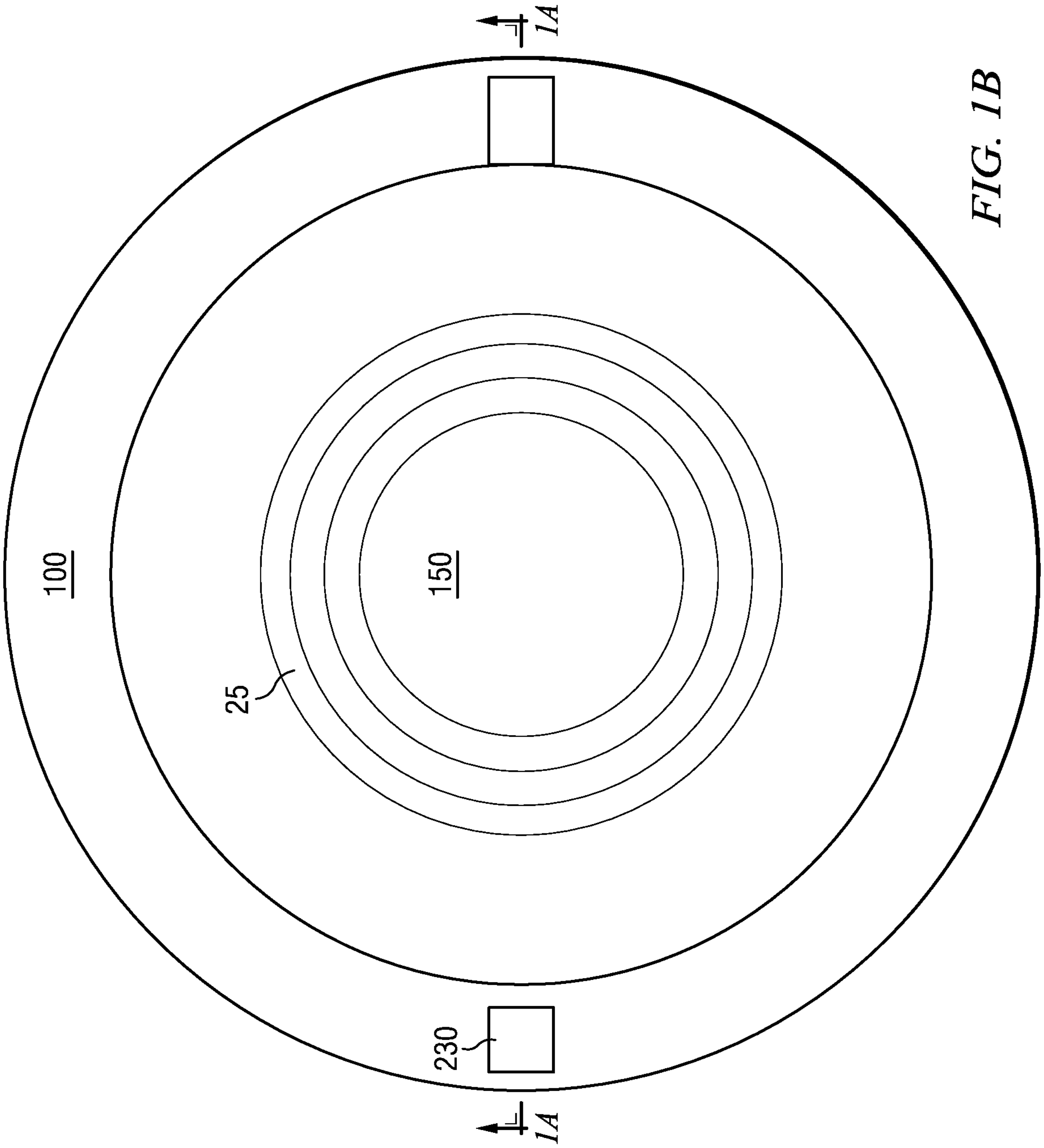

FIG. 1, which includes FIGS. 1A and 1B, illustrates a MEMS device in accordance with an embodiment of the invention, wherein FIG. 1A illustrates a cross sectional view and FIG. 1B illustrates a top view.

Referring to FIG. 1A, the MEMS device comprises a membrane layer 150 disposed over a substrate 100. The membrane layer 150 is held over the substrate wo and supported by a support structure comprising a spacer structure 210 and a protective layer 240. The membrane layer 150 comprises corrugations 25 to relieve stress across the membrane layer 150 especially when the membrane layer 150 is under maximum strain (deflection). Further, as further explained in various embodiments, the corrugations 25 comprise smooth edges having no sharp corners. The smooth edges avoid stress concentration within the corrugations 25. Material fracture is a function of crack nucleation and growth, which are a function of the peak stress concentration. Therefore, reducing the peak stress reduces crack nucleation thereby preventing fracture of the membrane layer 150. The use of smooth edges thus reduces the failure rate of the membrane layer 150 during operation thereby improving product life time. Alternatively, the embodiments of the invention improve mechanical sensitivity of the silicon microphone, which may help to produce microphones with high signal to noise ratio and high sensitivity.

The MEMS device further comprises a back plate 200. A plurality of bumps 195 is disposed on the back surface of the back plate 200. Contacts 230 electrically couple to the back plate 200, the membrane layer 150, and the substrate 100. The plurality of bumps 195 prevent the membrane layer 150 from sticking to the back plate 200 by minimizing the contact surface area when the membrane layer 150 deflects towards to the back plate 150. The MEMS device further includes a central cavity 50 and a gap 55 between the back plate 200 and the membrane layer 150. The central cavity 50 and the gap 55 allow the membrane layer 150 to oscillate.

As illustrated in FIG. 1B, the corrugations 25 are formed in a circular shape along the perimeter of the membrane layer 150. The circular shape avoids sharp edges along the lateral direction. Therefore, even if the membrane layer 150 is patterned in other shapes (such as rectangular, square shaped), the corrugations 25 may be formed as a circular or elliptical shape. Alternatively, the corrugations 25 may be formed as a square or rectangular shaped but having round edges in regions where two adjacent sides intersect.

Although, the embodiment illustrated in FIG. 1A, has positive corrugations (protruding part of the membrane layer 150 faces away from the substrate 100), the embodiments of the present invention also include negative corrugations or mixed corrugations.

As illustrated in FIG. 1A, each corrugation of the corrugations 25 has a sidewall and a bottom surface. Both the curvature of transition from sidewall to top surface of the corrugation 25 (having a first radius of curvature R1) and the curvature of the edge of sidewall to bottom surface (having a second radius of curvature R2) of the corrugation 25 have a smooth transition. In or more embodiments, the first and the second radius of curvatures R1 and R2 are about the same value and the first and the second radius of curvatures R1 and R2 are greater than the membrane layer 150, and greater by at least an order of magnitude in one embodiment. In one embodiment, the second radius of curvature R2 connecting the sidewall and the bottom surface is greater than about 100 nm so that a smooth transition is provided.

While embodiments of the invention are described using back plate 200 and a plurality of bumps 195, in other embodiments these may be not used. For example, embodiments of the invention include MEMS applications requiring a membrane layer 150 but with a back plate 200, e.g., pressure sensing with piezoelectric or piezoresistive or optical or else read out. Similarly, embodiments of the invention include multiple back plates, for example, capacitive sensors/actuators where the membrane layer 150 may be sandwiched between two back plates for differential read out or push-pull actuation.

Figure 2A:
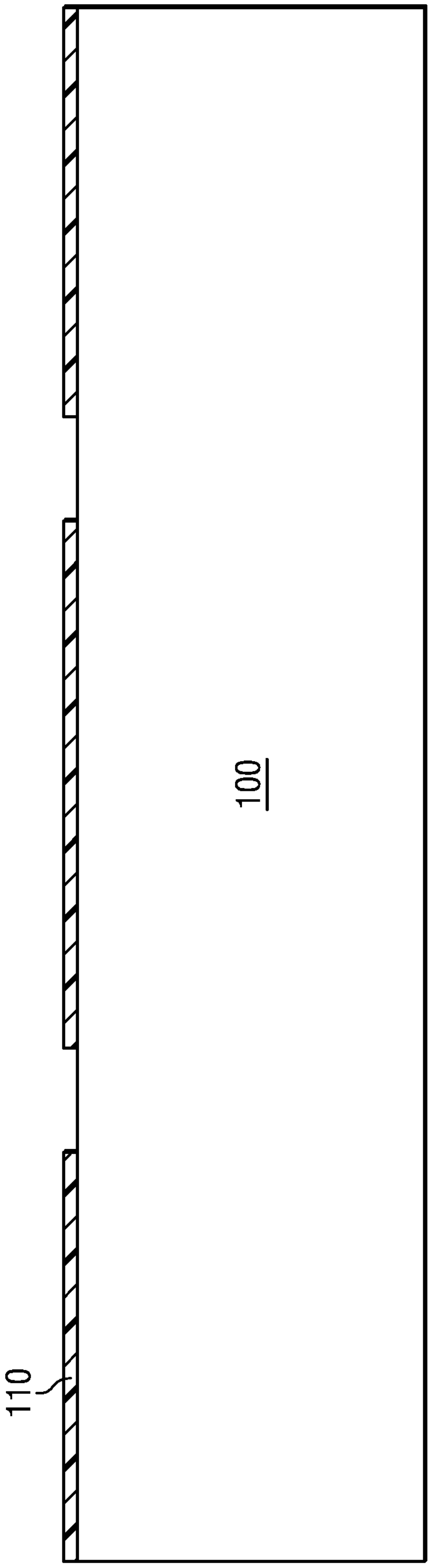
FIGS. 2A-2O, illustrates an embodiment of fabricating the semiconductor device comprising a MEMS sensor in accordance with embodiments of the invention.
Figure 2B:
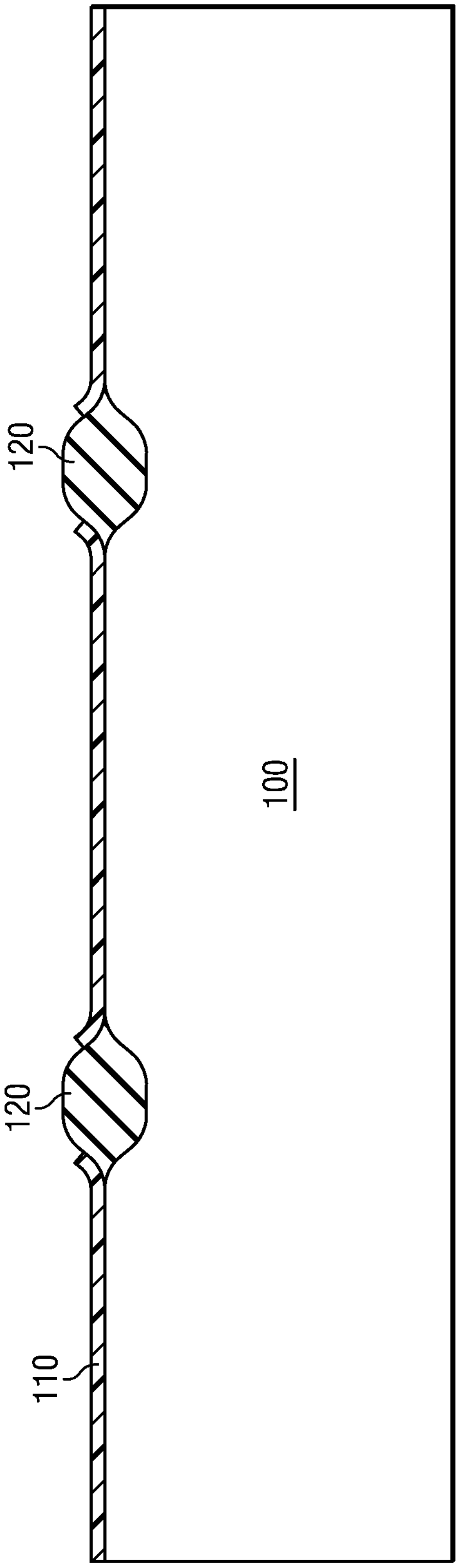
FIG. 2, which includes
Figure 2C:
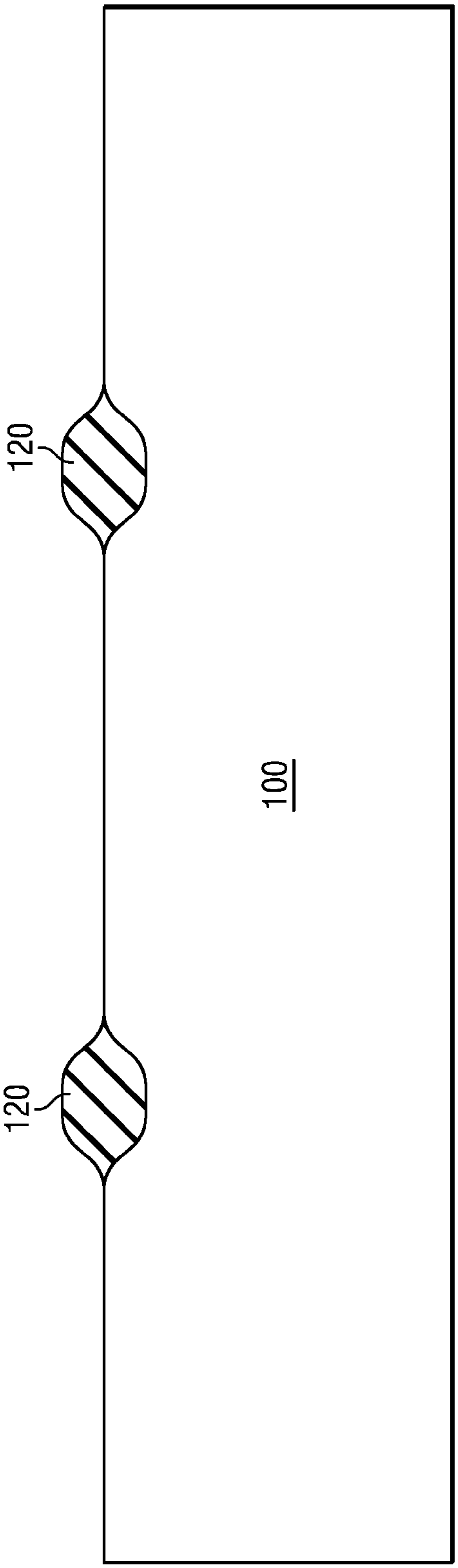
Figure 2D:
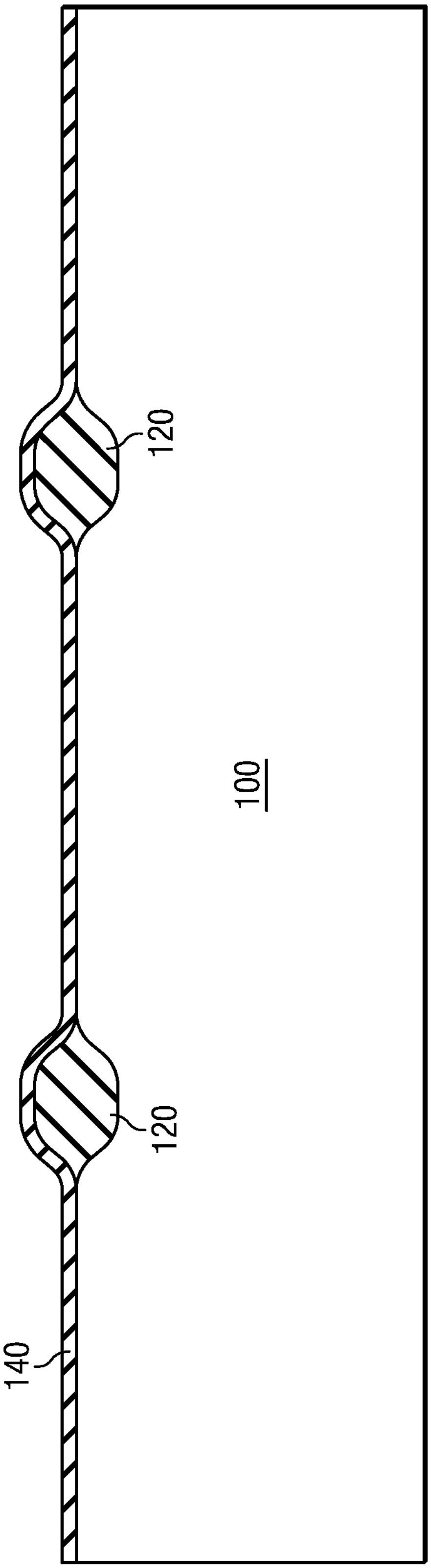
Figure 2E:
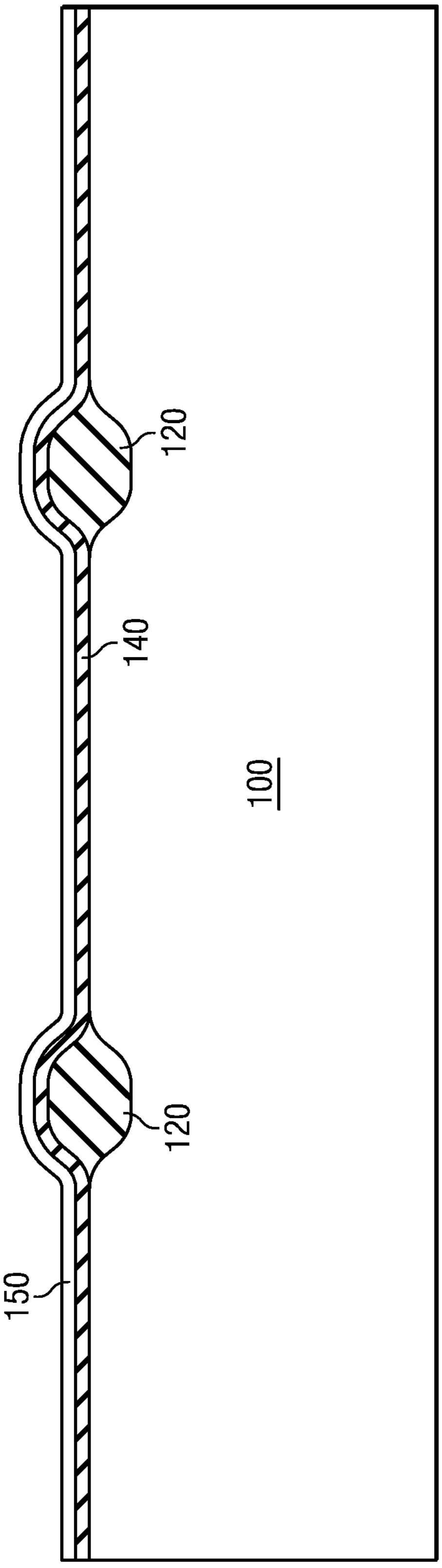
Figure 2F:
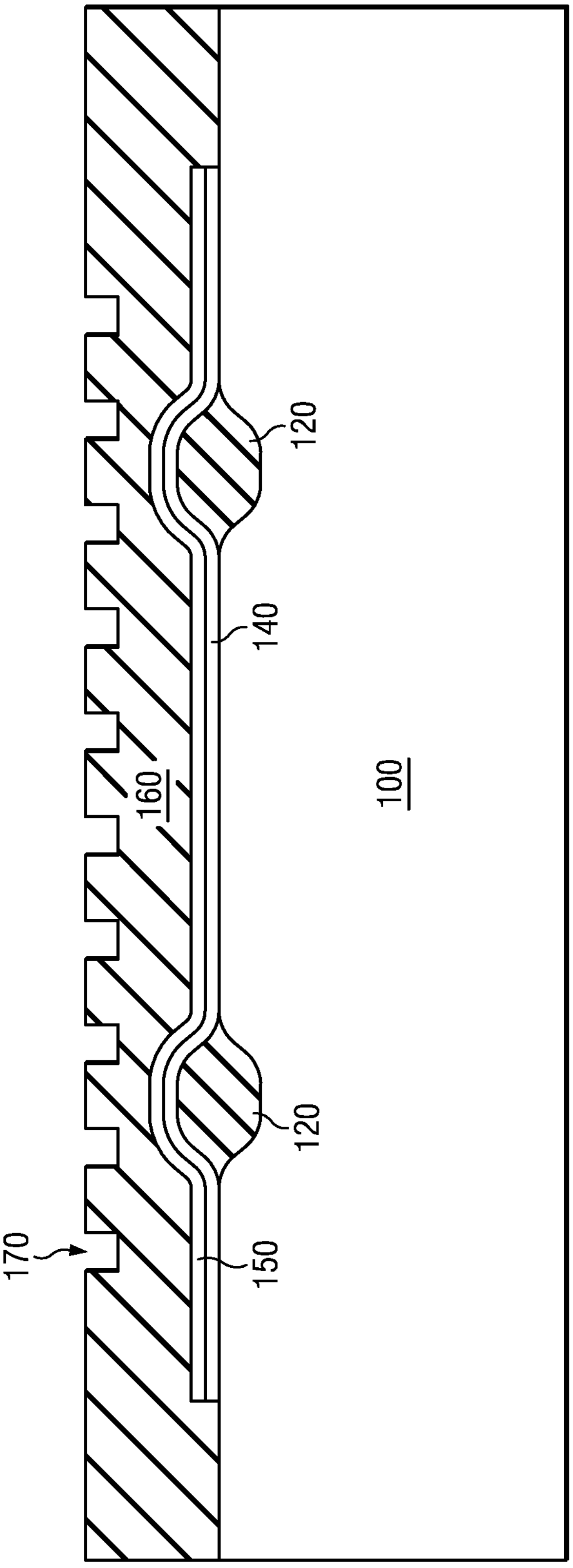
Figure 2G:
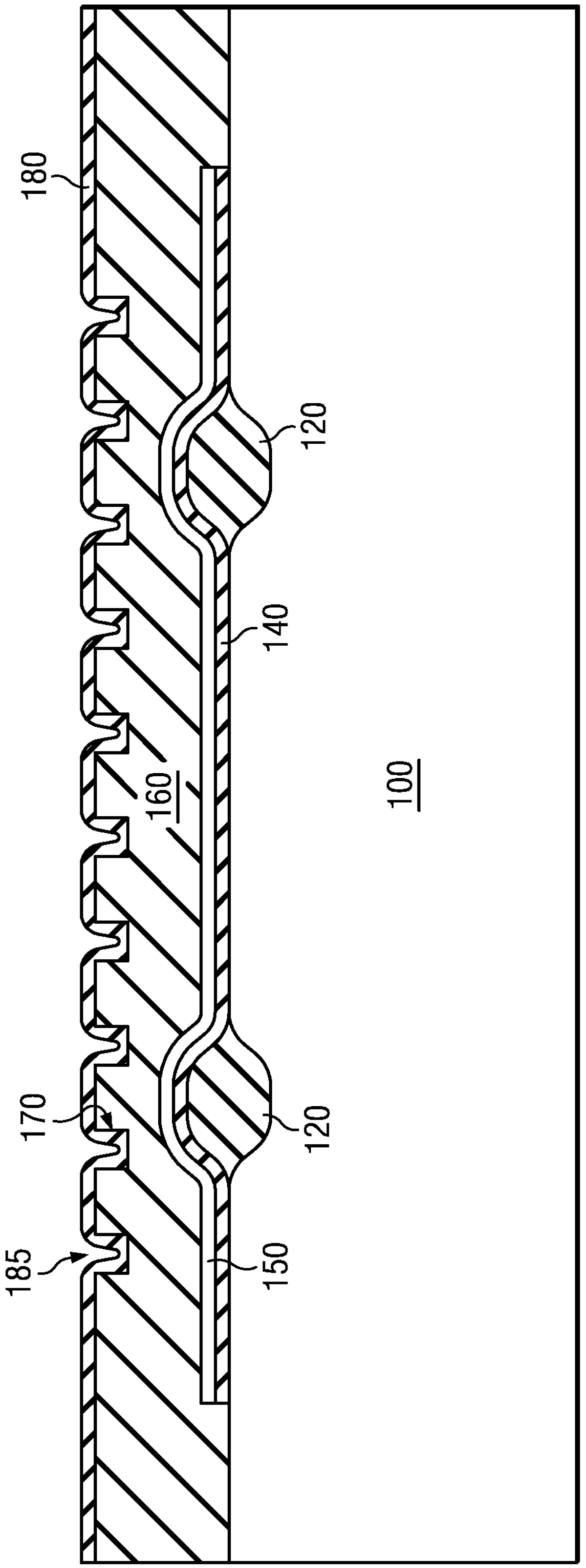
Figure 2H:
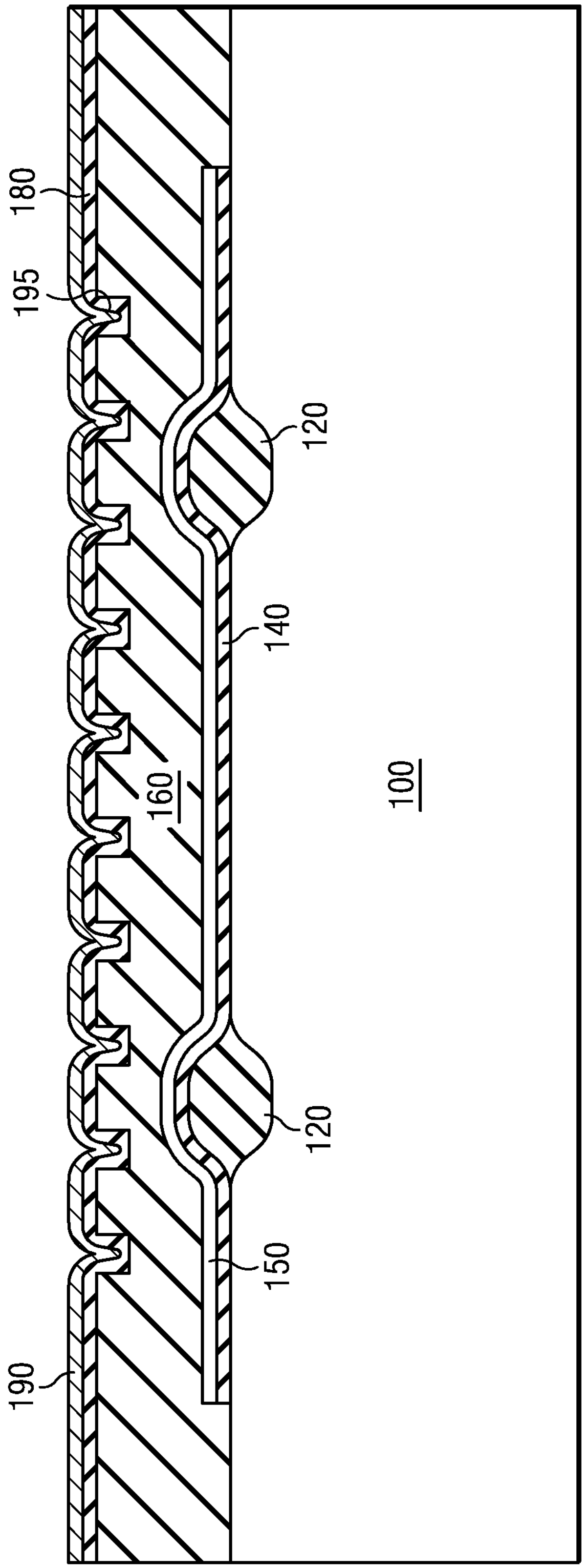
Figure 2I:
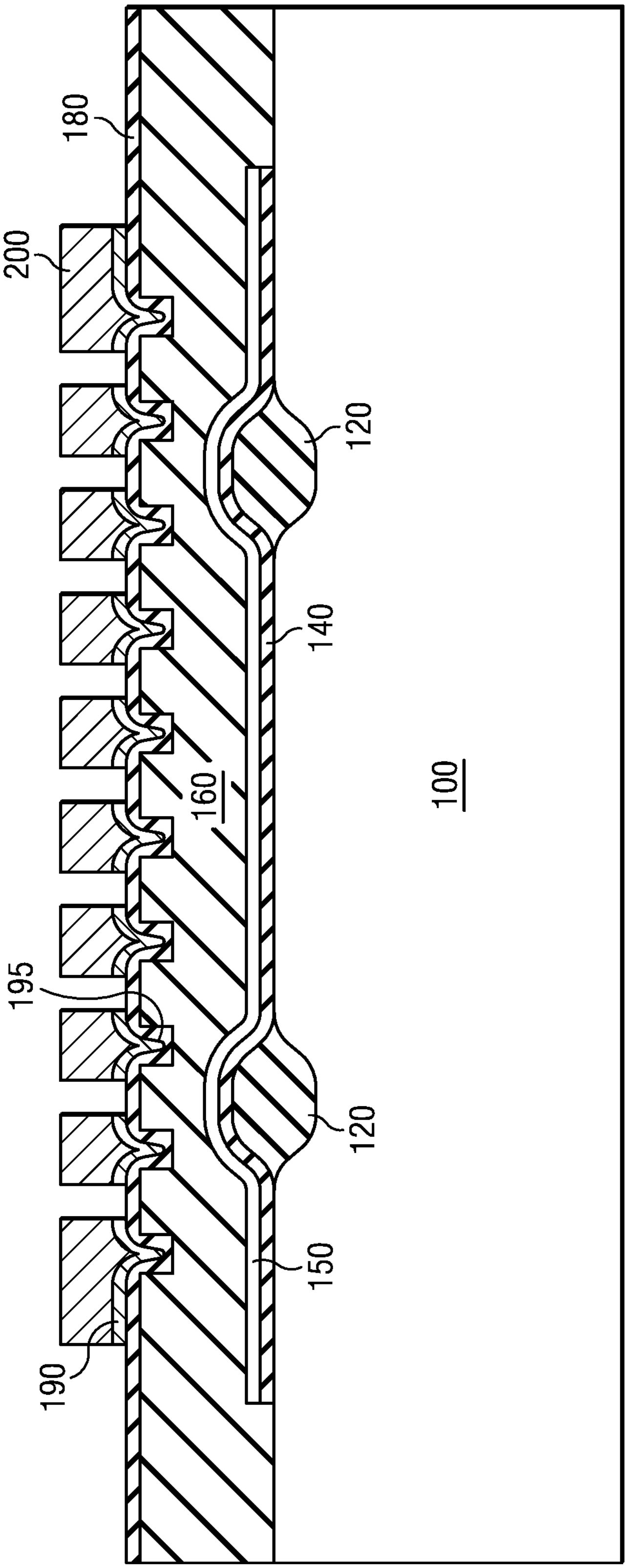
Figure 2J:
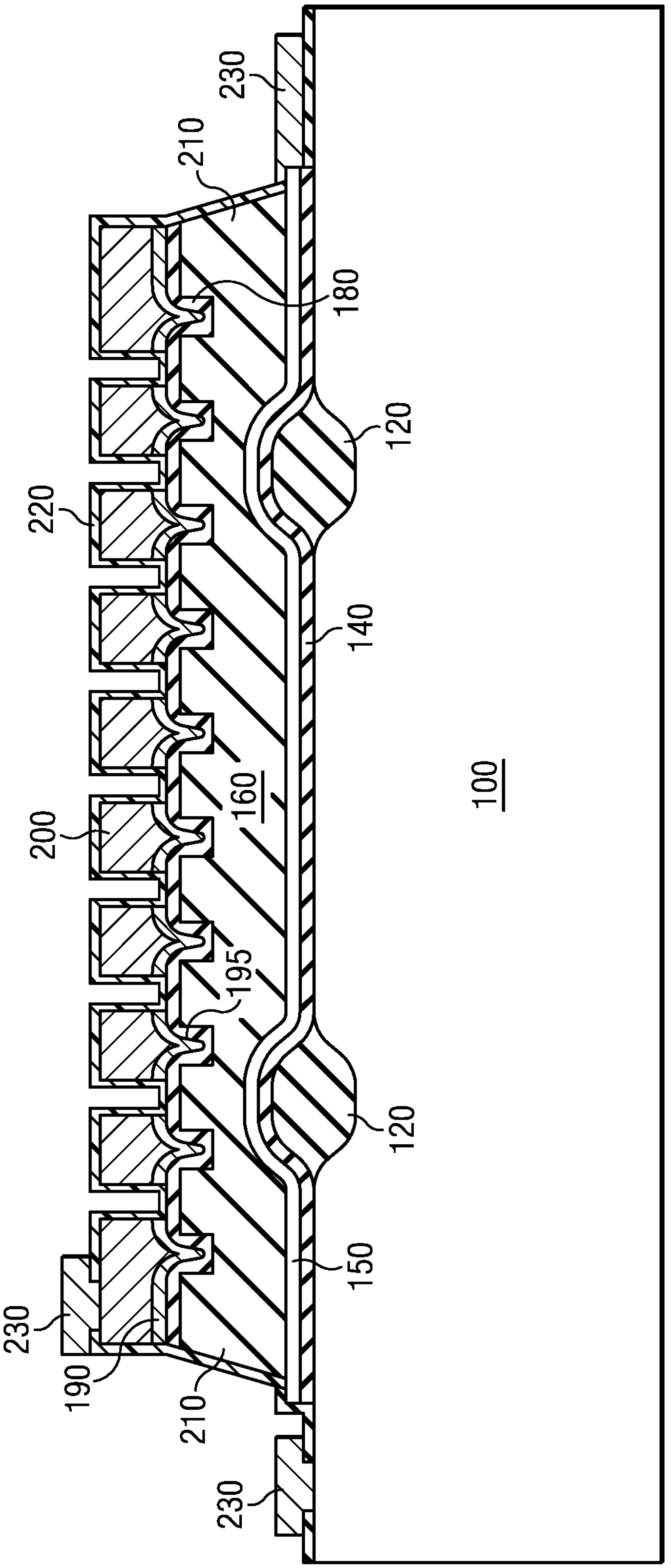
Figure 2K:
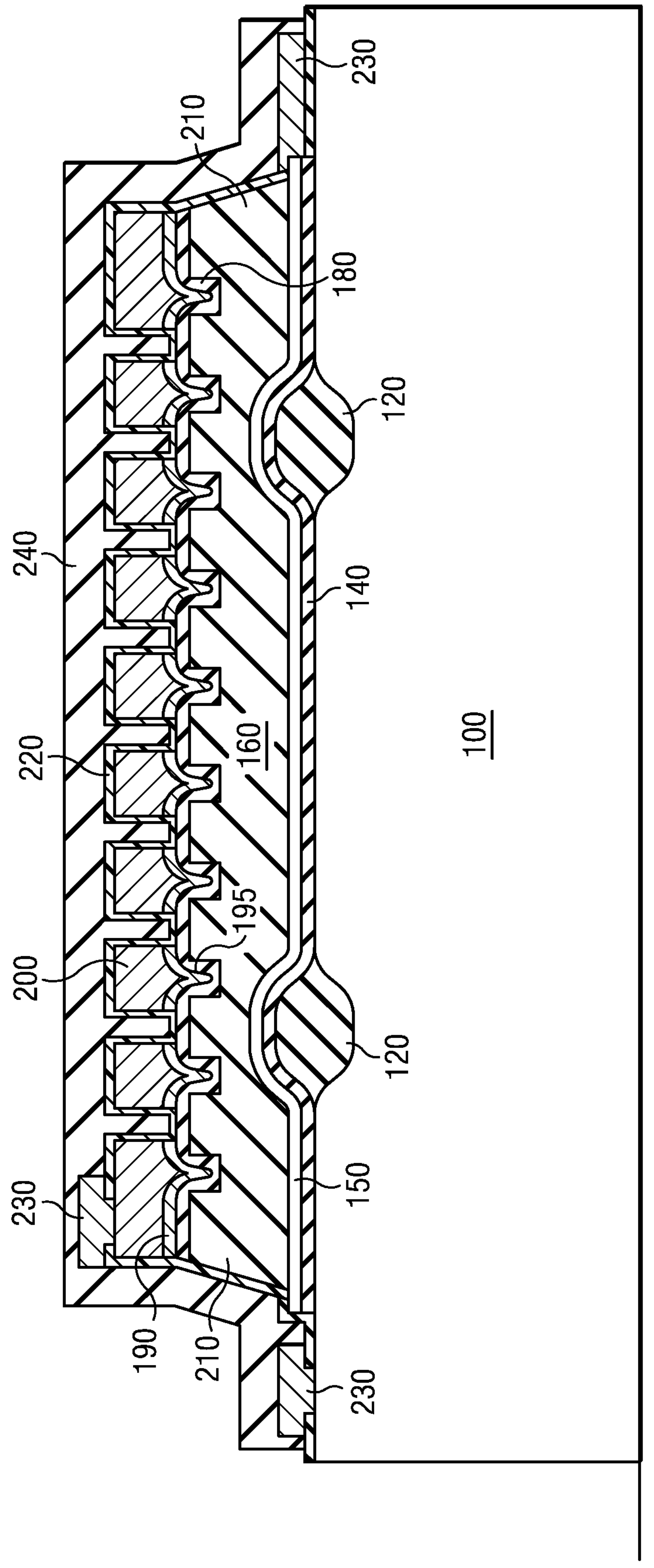
Figure 2L:
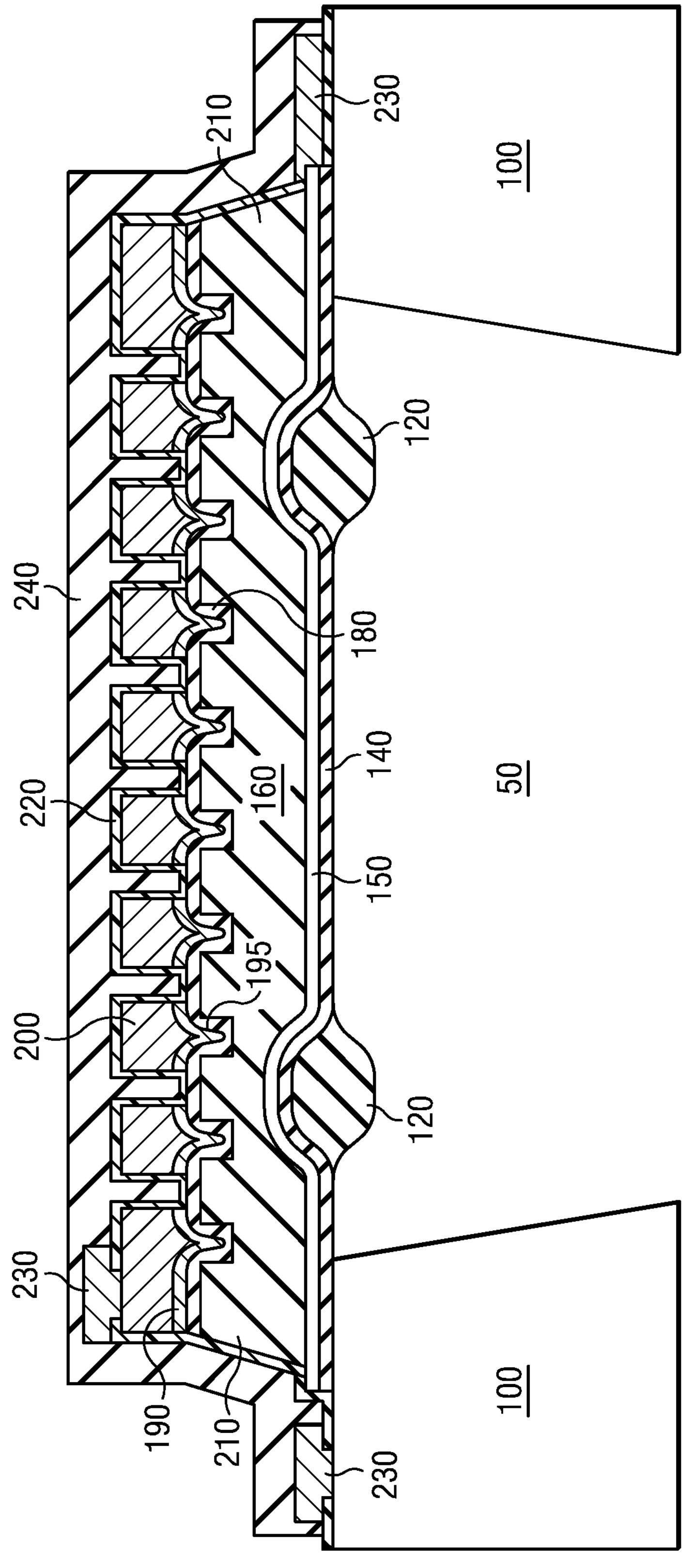
Figure 2M:
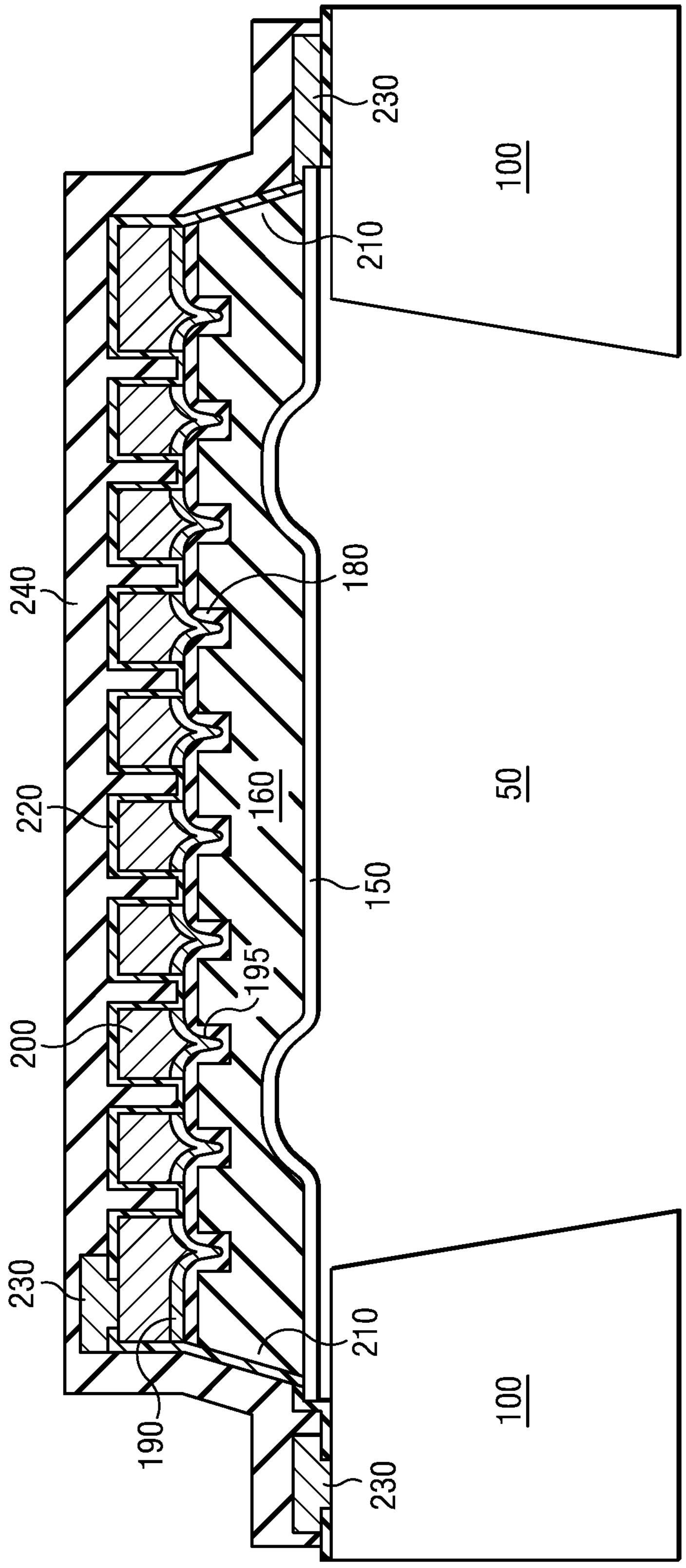
Figure 2N:
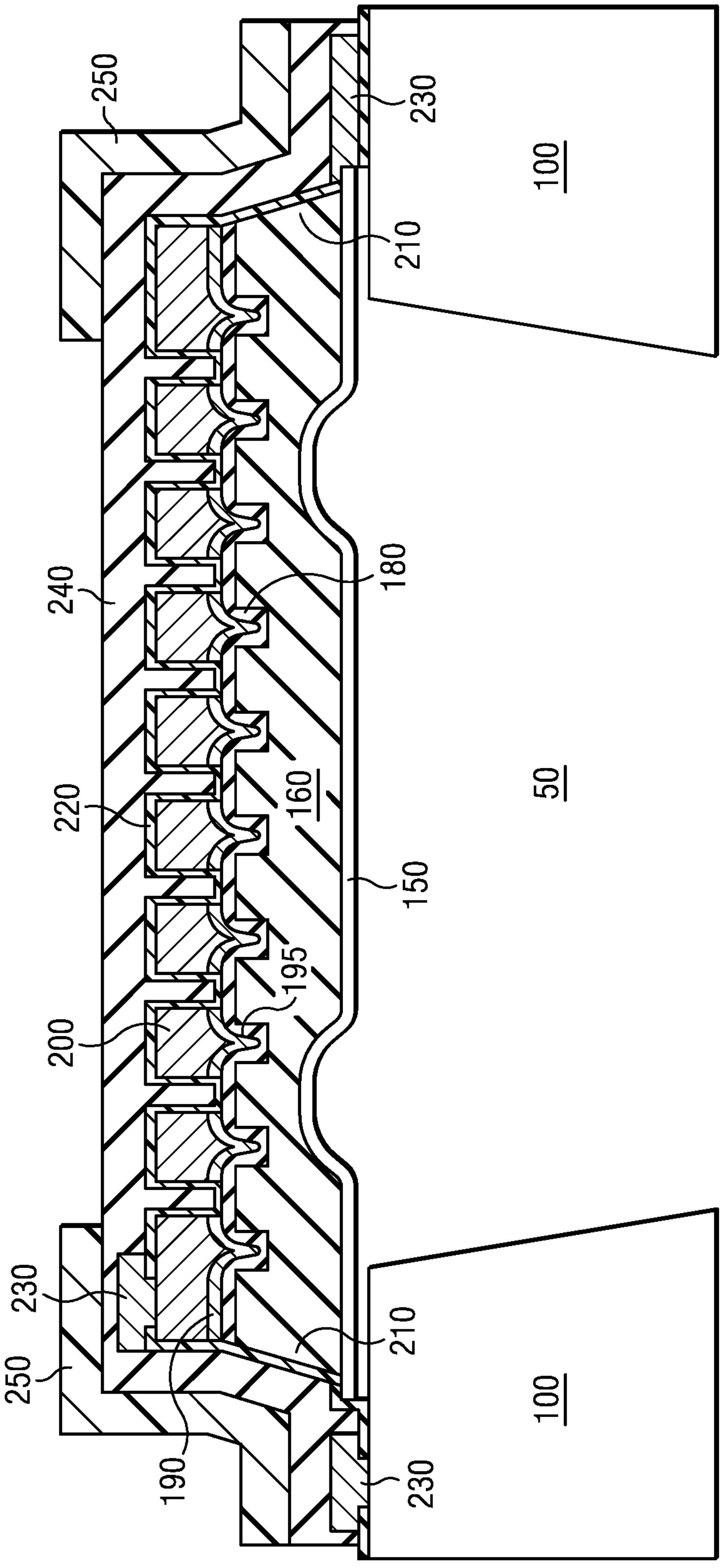
Figure 2O:
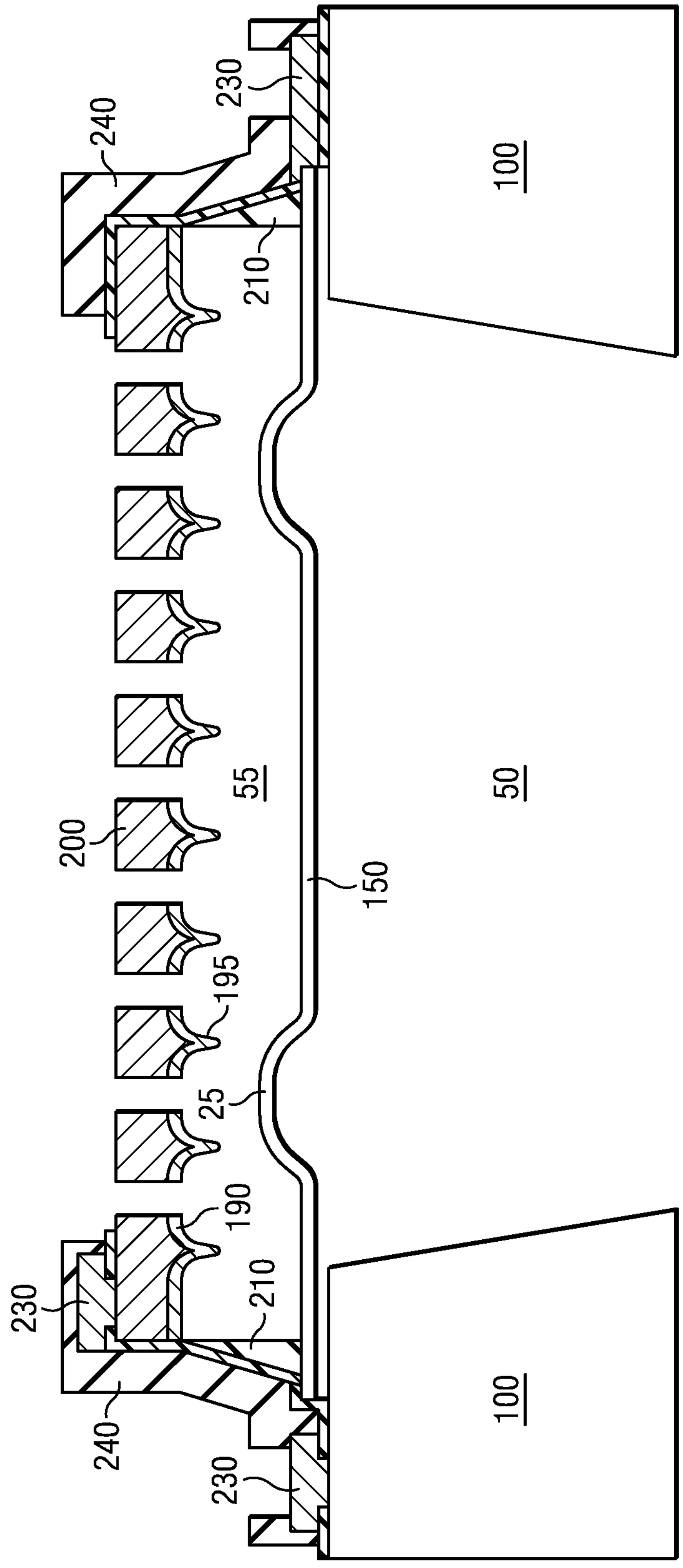

FIG. 2, which includes FIGS. 2A-2O, illustrates an embodiment of fabricating the semiconductor device comprising a MEMS sensor in accordance with embodiments of the invention.

FIG. 2A illustrates a masking layer no formed over a substrate 100. The substrate 100 may be a semiconductor substrate in various embodiments. The substrate 100 may be a semiconductor bulk substrate or a semiconductor on insulator substrate in some embodiments. Some examples of the substrate 100 include a bulk mono-crystalline silicon substrate (or a layer grown thereon or otherwise formed therein), a layer of {110} silicon on a {100} silicon wafer, a layer of a silicon-on-insulator (SOI) wafer, or a layer of a germanium-on-insulator (GeOI) wafer. In various embodiments, the substrate 100 may include blanket epitaxial layers. In various embodiments, the substrate 100 may be a silicon wafer, a germanium wafer, or may be a compound semiconductor substrate including indium antimonide, indium arsenide, indium phosphide, gallium nitride, gallium arsenide, gallium antimonide, lead telluride, or combinations thereof.

The masking layer 110 comprises an insulating layer in various embodiments. The masking layer no may be a nitride in one embodiment. In another embodiment, the masking layer 110 may be an oxide. The masking layer 110 may be formed by thermal oxidation or nitridation, or using vapor deposition processes such as chemical vapor deposition, plasma vapor deposition.

The masking layer 110 may comprise a hard mask material in one embodiment. In various embodiments, the masking layer 110 may comprise a nitride material such as silicon nitride. In one or more embodiments, the masking layer 110 comprises a pad oxide layer and a silicon nitride layer over the pad oxide layer. In an alternative embodiment, the masking layer no comprises a pad oxide layer, a poly silicon layer over the pad oxide layer, and a silicon nitride layer over the poly silicon layer. In another alternative embodiment, the masking layer no comprises a pad oxide layer, an amorphous silicon layer over the pad oxide layer, and a silicon nitride layer over the amorphous silicon layer.

The masking layer 110 is patterned for forming regions of local oxide, which as described further below form patterns for the corrugations of the membrane layer. The masking layer no is patterned, e.g., by depositing a layer of photosensitive material (not shown) such as a photo resist over the masking layer 110. The layer of photosensitive material is patterned using a lithography process, e.g., by exposure to light or radiation to transfer a pattern from a lithography mask (not shown) to the layer of photosensitive material, and the photosensitive material is developed. The layer of photosensitive material is then used as an etch mask while portions of the masking layer 110 are etched away, leaving the structure shown in FIG. 2A.

As next illustrated in FIG. 2B, local oxidation is performed to form oxide regions 120. As will be described further below, the oxide regions 120 define the structures for the corrugation grooves in the membrane that is being fabricated. Exposed portions of the substrate 100 are oxidized using a thermal oxidation process to form oxide regions 120. The masking layer no blocks oxidation of the underlying substrate 100. Therefore, the oxidation proceeds locally. In one or more embodiments, the masking layer no protects other regions (such as other device regions) of the substrate wo from being oxidized while forming a thick local oxide in exposed portions of the substrate 100.

In various embodiments, the oxidation may be performed using a dry oxidation, wet oxidation, a water ambient, or a mixed ambient. For example, the substrate 100 may be exposed to an oxygen-containing substance, a silicon-containing substance, and/or increased temperature to convert a portion of the substrate 100 into an oxide material.

During the oxidation process, a surface layer of silicon reacts to form an oxide. Subsequent oxidation progresses by diffusion of oxygen through the oxide layer and reacting at the interface between the growing oxide and the substrate 100.

In an alternative embodiment, a smoothing layer may be deposited over the substrate 100 before forming the masking layer 110. The smoothing layer may be formed as a blanket layer or alternatively, over the substrate 100 only in the regions of the MEMS device that is being fabricated. The smoothing layer may be a poly silicon layer in one embodiment and may result in smoother corners due to improved stress relaxation during the oxidation process.

Similarly, in an alternative embodiment, the substrate 100 may be etched using an anisotropic or isotropic etch before exposing to the oxidation process. This may allow tailoring of the lateral profile of the oxide regions 120 formed under the masking layer 110.

In various embodiments, the oxidation process is continued to form oxide regions 120 having a depth of about 1000 nm to about 6000 nm, and having a width of about 1 μm to about 20 μm.

The masking layer no is then removed, as illustrated in FIG. 2C. Because of the nature of the oxidation process a portion of the oxide regions 120 protrudes above the top surface of the substrate 100. Further, the oxide regions 120 have a smooth interface (silicon/oxide boundary) because of the oxidation process. Oxidation, unlike deposition processes, is a diffusion-reaction process involving high temperatures and relatively slower oxidation rates, which results in an interface having no sharp edges between the substrate 100 and the oxide regions 120. In some embodiments, further smoothing may be performed, for example, by the use of additional anneals such as in a hydrogen atmosphere. The hydrogen anneal may further smooth the oxide regions 120 particularly around the corners and result in a smooth profile as illustrated in FIG. 2C.

Referring next to FIG. 2D, a first sacrificial liner 140 is deposited over the substrate 100. The first sacrificial liner 140 is an oxide, such as silicon oxide, in one embodiment. The first sacrificial liner 140 may be deposited using a vapor deposition process such as chemical vapor deposition, or plasma vapor deposition in various embodiments. The first sacrificial liner 140 comprises a thickness of about 100 nm to about 10000 nm.

Next, as illustrated in FIG. 2E, a membrane layer 150 is deposited over the first sacrificial liner 140. The membrane layer 150 may form an electrode of a capacitor in various embodiments. In one embodiment, the membrane layer 150 forming the capacitor is part of a capacitive microphone. In various embodiment, the membrane layer 150 may be formed incorporating the structural features (such as the smooth transitions) described in various embodiments, for example, as described with respect to FIG. 1A.

In one embodiment, the membrane layer 150 comprises a poly silicon layer. In an alternative embodiment, the membrane layer 150 comprises an amorphous silicon layer. In alternative embodiments, the membrane layer 150 comprises a conductive layer. The membrane layer 150 has a thickness of about 100 nm to about 2000 nm in various embodiments. In one or more embodiments, the membrane layer 150 has a thickness of about 200 nm to about 1000 nm, and about 330 nm in one embodiment.

As illustrated in FIG. 2E, the membrane layer 150 and optionally the underlying first sacrificial liner 140 may be patterned. The membrane layer 150 is removed from other regions of the substrate 100.

Referring next to FIG. 2F, a first sacrificial material layer 160 is deposited over the membrane layer 150. In one or more embodiments, the first sacrificial material layer 160 may comprise an oxide, such as tetra ethyl oxysilane (TEOS). The first sacrificial material layer 160 is patterned to form recesses 170. The recesses 170 define structures for forming bumps in the back plate as will be described below.

In various embodiments, the lateral geometry of the recesses 170 is chosen such that the recesses 170 for the definition of the bumps are so narrow that the recesses 170 will be almost closed after a subsequent layer deposition. For example, the recesses 170 may comprise a width of about 1000 nm if a subsequent layer of 600 nm is deposited. In other words, in various embodiments, the lateral dimension of the recesses 170 is approximately in the range of the thickness of the subsequent layer to be disposed.

Referring to FIG. 2G, a second sacrificial liner 180 is deposited over the first sacrificial material layer 160. The second sacrificial liner 180 may be the same material as the first sacrificial material layer 160. The second sacrificial liner 180 may be a etch stop liner material in one embodiment. As described above, the thickness of the second sacrificial liner 180 is chosen so as to approximately fill the recesses 170. Consequently, bump holes 185 having a sharp triangle-like shape are formed after depositing the second sacrificial liner 180.

As next illustrated in FIG. 2H, the bump liner 190 is deposited forming a plurality of bumps 195. The bump liner 190 comprises a material having a different etch selectivity than the first sacrificial material layer 160. The bump liner 190 may be an etch stop liner material in one embodiment. Because of the sharp cavities of the bump holes 185, the bump liner 190 includes sharp needle like shape, which minimizes the contact surface area between the membrane layer 150 and the plurality of bumps 195 if the membrane layer 150 contacts the plurality of bumps 195 during device operation.

Referring next to FIG. 2I, a back plate 200 is deposited over the bump liner 190 and patterned. The exposed bump liner 190 may also be patterned. In various embodiments, the back plate 200 forms a portion of a capacitor, for example, a portion of a capacitive microphone. The back plate 200 comprises a poly silicon material in one embodiment.

Referring next to FIG. 2J, contacts 230 and spacer structures 210 are formed. The first sacrificial material layer 160 may be removed from an outside region leaving spacer structures 210 for supporting the MEMS device region. A protective liner 220 is deposited covering the back plate 200. Contacts 230 are formed to couple the back plate 200 and the membrane layer 150. The contacts 230 are formed after masking and patterning the protective liner 220.

Referring to FIG. 2K, the front side is protected by forming a protective layer 240. The protective layer 240 protects the front side during the subsequent back side processing. In various embodiments, the protective layer 240 may comprise silicon nitride or silicon oxide.

Back side processing continues from FIG. 2L to form a cavity 50. The wafer is reversed to expose the back side. Next a resist is deposited on the exposed back side and patterned (not shown) and a portion of the substrate 100 in the MEMS device region is exposed. The exposed substrate 100 is etched until the first sacrificial liner 140 and the oxide regions 120 are exposed.

In various embodiments, the substrate 100 may be etched using a Bosch Process, or by depositing a hard mask layer and etching the substrate 100 using a vertical reactive ion etch. In one embodiment, only a resist mask is used. If the resist budget is not sufficient, the hard mask and vertical reactive ion etch may be used to achieve a smooth sidewall. However, this integration scheme requires the removal of remaining hard mask residues. Hence, in some embodiments, a Bosch process may be used without additional hard mask.

In the Bosch process, an isotropic plasma etch step and passivation layer deposition step are alternated. The etching/deposition steps are repeated many times during the Bosch process. The plasma etch is configured to etch vertically, e.g., using Sulfur hexafluoride [SF6] in the plasma. The passivation layer is deposited, for example, using octafluoro-cyclobutane as a source gas. Each individual step may be turned on for a few seconds or less. The passivation layer protects the substrate 100 and prevents further etching. However, during the plasma etching phase, the directional ions that bombard the substrate remove the passivation layer at the bottom of the trench (but not along the sides) and etching continues. The Bosch process is stopped when the first sacrificial liner 140 and the oxide regions 120 are exposed. The Bosch process produces sidewalls that are scalloped.

Referring next to FIG. 2M, the first sacrificial liner 140 and the oxide regions 120 are removed, for example, using a wet etch chemistry. The wet etch stops after the membrane layer 150 is exposed.

Referring to FIG. 2N, the front side is patterned to open the MEMS device area while protecting the remaining regions, for example, the contacts 230. A resist 250 is deposited over the front side and patterned as illustrated. The resist 250 may comprise a silicon nitride material in one embodiment, and may comprise a hard mask in one embodiment. Thus, the MEMS device region may be exposed to a wet etch process that may be able to efficiently remove a particular type of material.

As next illustrated in FIG. 2O, the first sacrificial material layer 160 and the second sacrificial liner 180 are removed, e.g., using a wet etching process. The protective layer 240 is removed. In one or more embodiments, the protective layer 240 may be etched, using an anisotropic etch process, leaving a support spacer. The first sacrificial material layer 160 and the second sacrificial liner 180 may be removed from the front side in one embodiment after removing the protective layer 240.

In some embodiments, the first sacrificial material layer 160, the second sacrificial liner 180, the oxide regions 120, and the first sacrificial liner 140 may be removed during the same step.

Because the first sacrificial liner 140 and the membrane layer 150 are formed over the oxide regions 120, the corrugations 25 in the membrane 150 are positive, i.e., facing away from the substrate 100.

Figure 3:
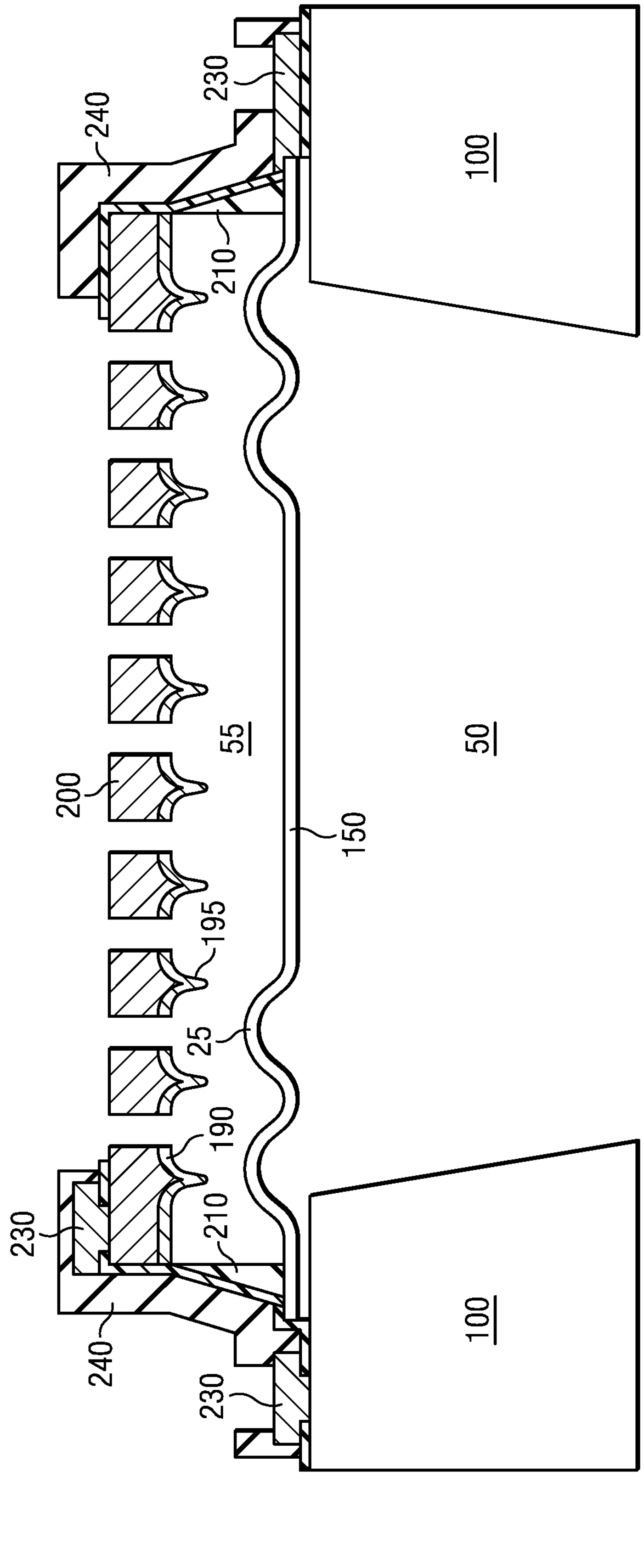
FIG. 3 illustrates an embodiment of a MEMS device in which the membrane layer includes multiple corrugations.

FIG. 3 illustrates an embodiment of a MEMS device in which the membrane layer includes multiple corrugations. In various embodiments, the number of corrugations may be chosen to optimize the stress in the membrane layer 150. Therefore, embodiments of the invention may be fabricated using multiple oxide regions 120, which results in increasing the number of corrugations. FIG. 3 illustrates two corrugations 25, and in various more number of corrugations may be formed.

Figure 4A:
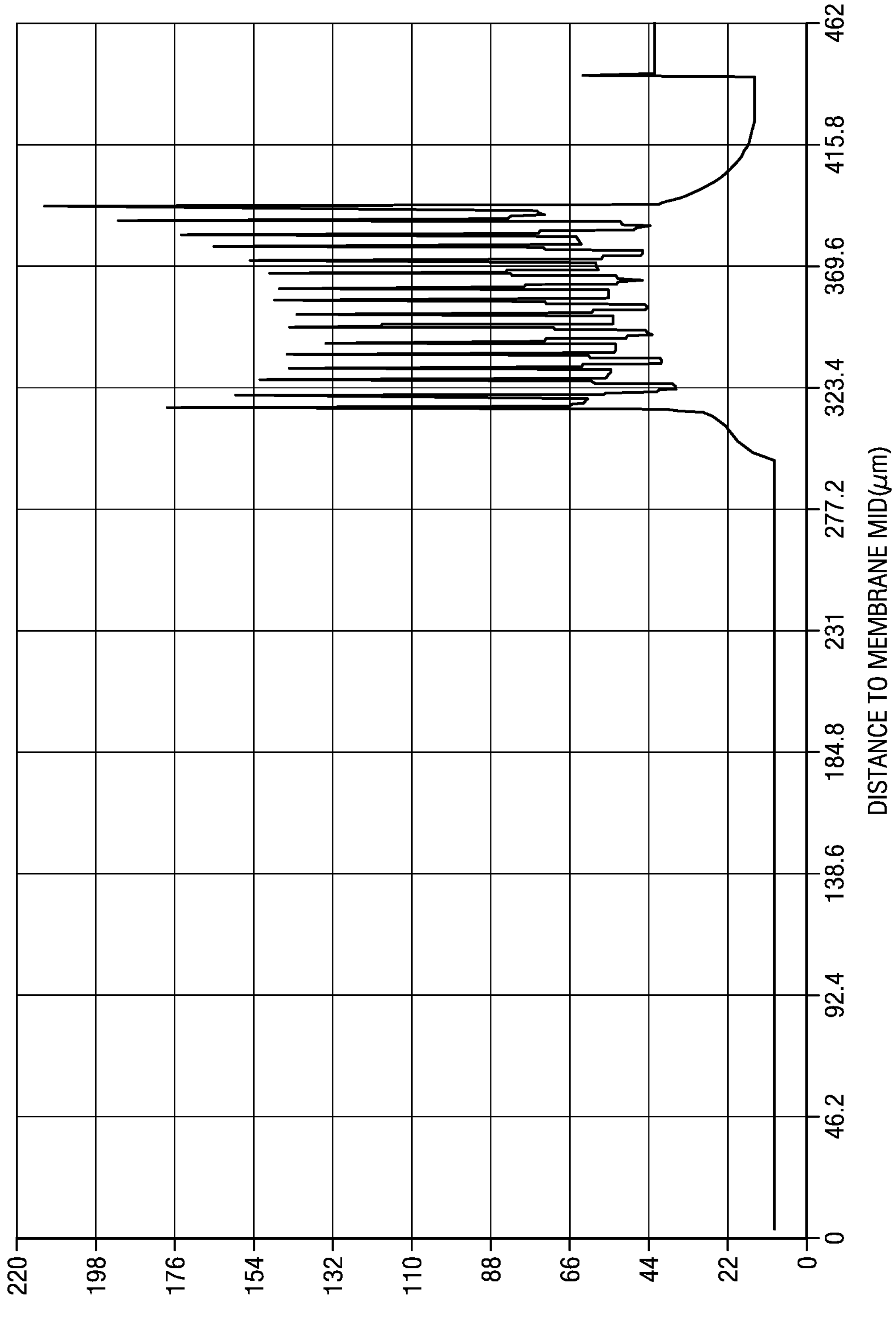
Figure 4B:
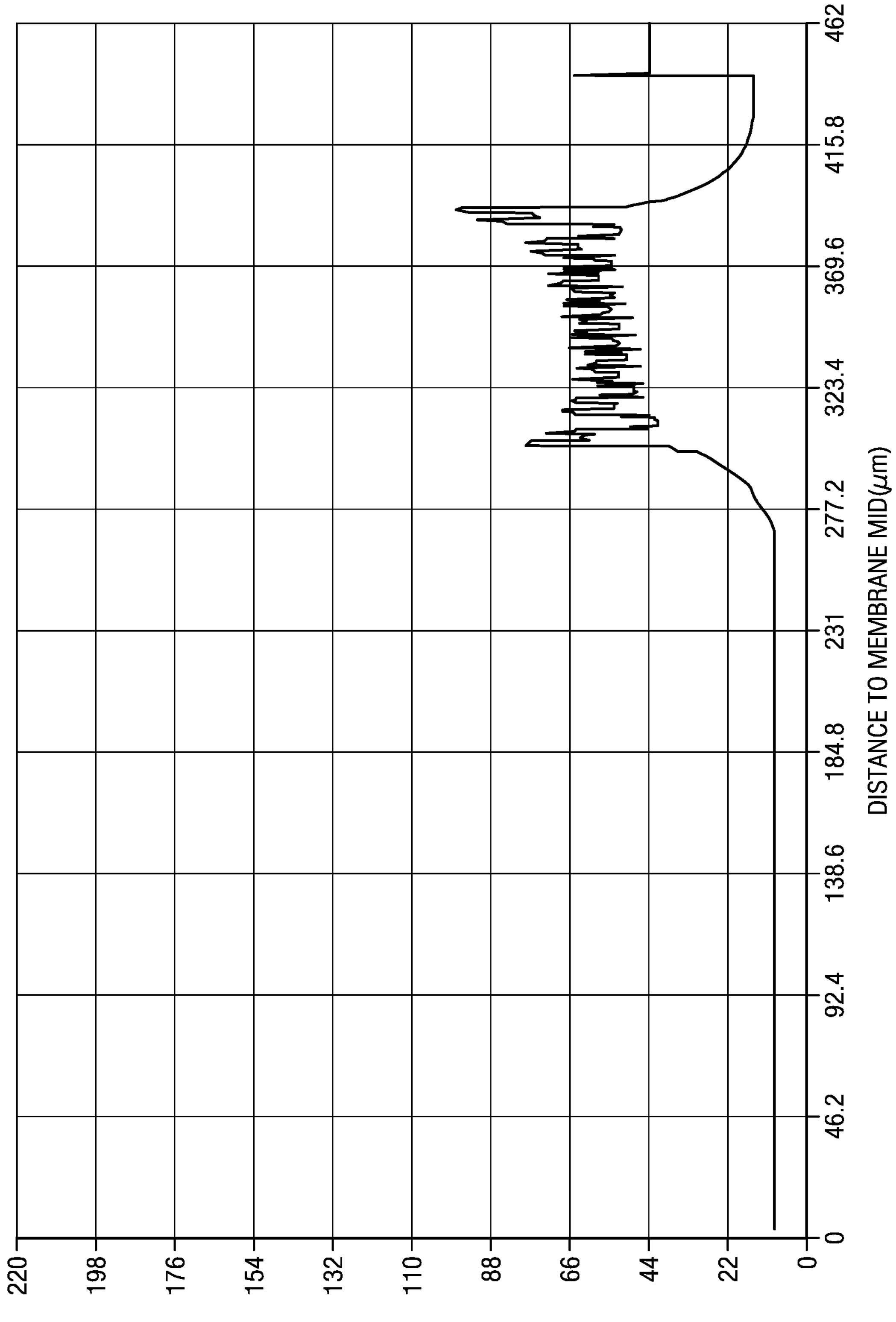

FIG. 4, which includes FIGS. 4A and 4B, illustrates lateral stress along the membrane layer for two different configurations of the corrugation, wherein FIG. 4A illustrates the stress for a corrugation with sharp edges, and wherein FIG. 4B illustrates the stress for a corrugation with smooth edges as described herein in various embodiments.

FIG. 4 illustrates simulation results obtained after Finite Element Modeling Simulations (FEM) of the two different types of corrugation structures. Referring to FIG. 4, the origin of the plot in FIGS. 4A and 4B is the center of the membrane layer such that the x-axis is along the radius of the membrane layer towards the support structures (see, e.g., FIG. 1). These simulations are performed for eight corrugation rings on a membrane of 0.9 mm diameter; however, the general idea may be extended to any number of rings and membrane sizes.

As illustrated in FIG. 4A, the stress is flat and increases dramatically in the corrugated regions. This may result in breaking of the membrane, e.g., due to crack nucleation and growth when a critical stress is reached. For crack propagation, the peak stress is a significant metric as crack nucleation begins from such regions. However, as illustrated in FIG. 4B, the use of smooth edges as described in various embodiments, reduces the peak stress within the corrugation regions.

While FIG. 4 illustrates the lateral component of the stress, the inventors find other quantitative measures such as Von Mises stress, which suggests the onset of plastic deformation, also show a similar difference between corrugations having sharp edges and corrugations having smooth edges as described in various embodiments of the present invention.

FIG. 5 illustrates a table summarizing the simulation results of FIG. 4. The table shows the value of the peak stress when pressure is applied from the top and bottom of the membrane layer, which relates to +/− vertical displacement of the membrane layer. The peak stress values drop significantly when the sharp edge is replaced with a smooth edge (compare first row, which is for a sharp edge, to the second row, which is for the smooth edge).

FIG. 6, which includes FIG. 6A-6D, illustrates a MEMS device with a membrane layer having negative corrugations during various stages of fabrication, in accordance with an embodiment of the invention.

Referring to FIG. 6A, the oxide regions 120 are formed as described above in prior embodiments (see e.g., FIG. 2B). After forming the oxide regions 120 having smoothed edges as described in various embodiments, the masking layer no and the oxide regions 120 are removed. Thus, a plurality of trenches 125 are formed within the substrate 100 as illustrated in FIG. 6B.

Next, as illustrated in FIG. 6C, a first sacrificial liner 140 is formed. As discussed above with respect to FIG. 2, the first sacrificial liner 140 may comprise a silicon oxide material in one embodiment. The first sacrificial liner 140 lines the plurality of trenches 125. The thickness of the first sacrificial liner 140 is much smaller than the dimensions of the plurality of trenches 125 so that the first sacrificial liner 140 does not significantly fill the plurality of trenches 125.

Referring to FIG. 6D, a membrane layer 150 is formed over the first sacrificial liner 140. Subsequent processing follows as described in the embodiment following FIGS. 2F-2O. Because the first sacrificial liner 140 and the membrane layer 150 are formed within the plurality of trenches 125, the resulting corrugations in the membrane 150 are negative corrugations 225 (relative to the positive corrugations of FIG. 2) facing towards the substrate 100.

FIG. 7, which includes FIG. 7A-7D, illustrates a MEMS device during various stages of processing in accordance with an embodiment in which the membrane layer of the MEMS device is formed over a plurality of substrate protrusions.

Figure 7A:
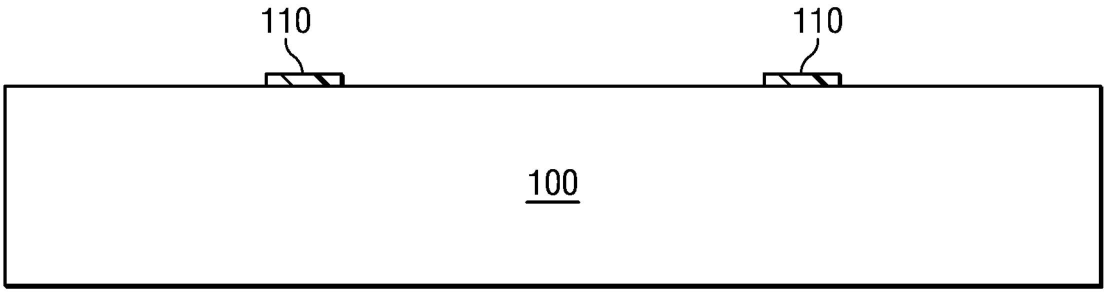
FIGS. 7A-7D, illustrates a MEMS device during various stages of processing in accordance with an embodiment in which the membrane layer of the MEMS device is formed over a plurality of substrate protrusions.

Referring to FIG. 7A, a masking layer 110 is deposited as in prior embodiments. However, the masking layer 110 is patterned negatively relative to the embodiment of FIG. 2. Unlike FIG. 2, the masking layer 110 is not removed from regions in which corrugations are to be formed. Rather, the masking layer no is removed from regions in which corrugations are not to be formed.

Figure 7B:
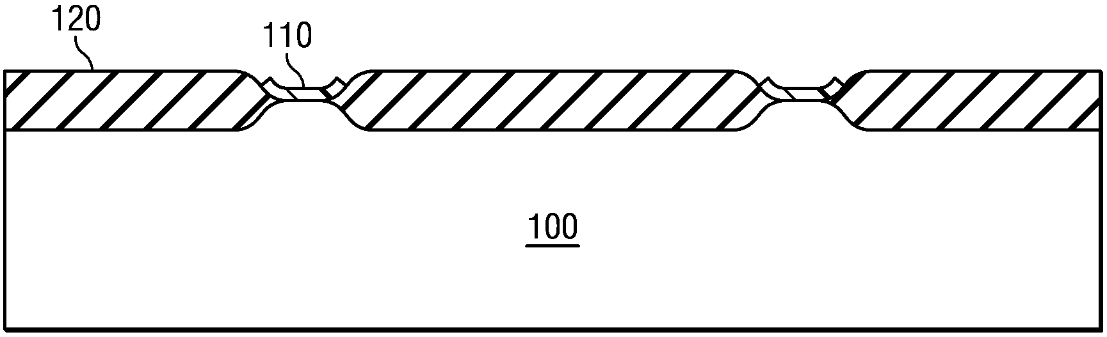

The exposed substrate 100 is next oxidized locally as described above with respect to FIG. 2 forming an oxide/substrate profile with smooth edges (FIG. 7B). Because of the volume expansion of oxide relative to silicon, the top surface of the oxide regions 120 rises above the remaining substrate 100. For the same reason, the lower surface of the oxide regions 120 is below the top surface of the remaining substrate 100.

Figure 7C:
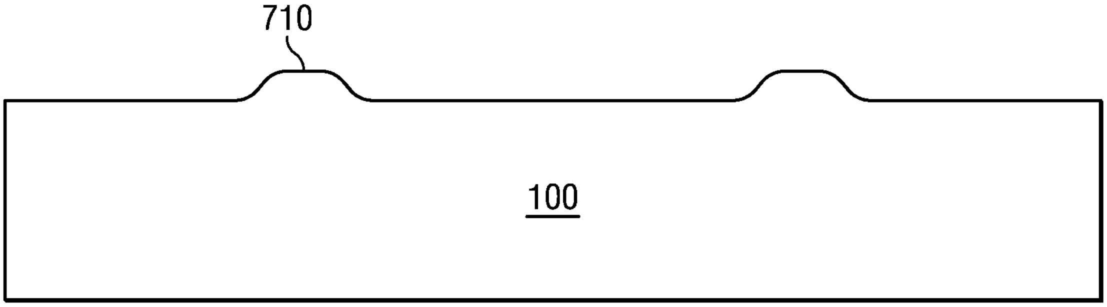

As next illustrated in FIG. 7C, the masking layer no and the oxide regions 120 are removed leaving a plurality of substrate protrusions 710.

Figure 7D:
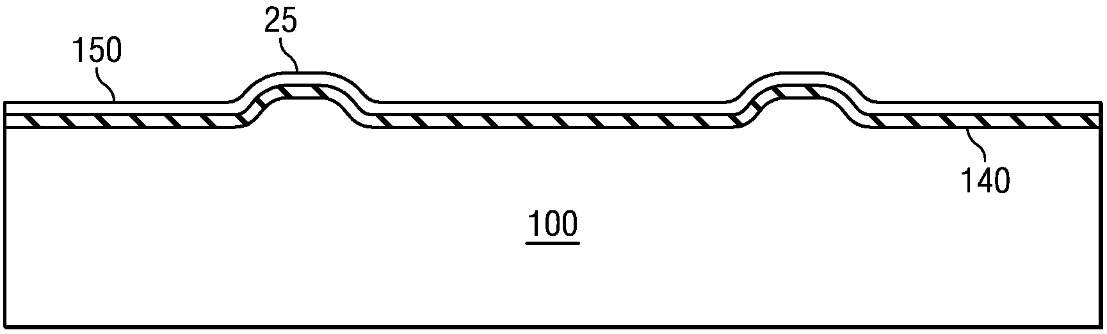

Referring to FIG. 7D, a first sacrificial liner 140 and a membrane layer 150 are formed. Subsequent processing follows as described in the embodiment following FIGS. 2F-2O. Because the first sacrificial liner 140 and the membrane layer 150 are formed over the plurality of substrate protrusions, the resulting corrugations in the membrane 150 are corrugations 25 with positive curvature (facing away from the substrate 100).

Figure 8A:
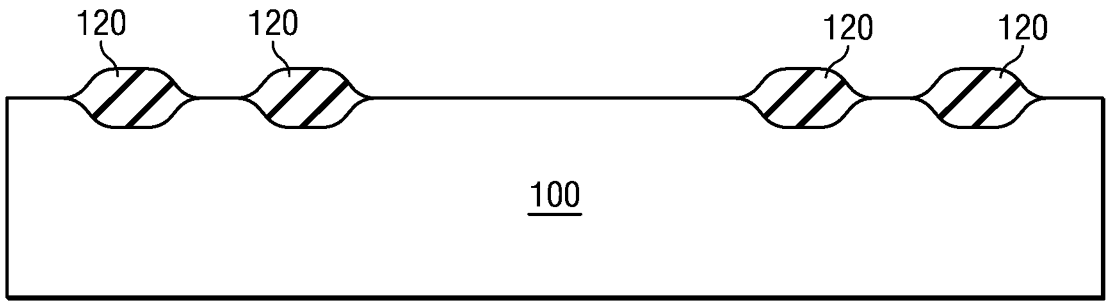
FIGS. 8A-8C, illustrates an embodiment of the invention of a MEMS device in various stages of processing, wherein a membrane layer of the MEMS device includes positive and negative corrugations.
Figure 8B:
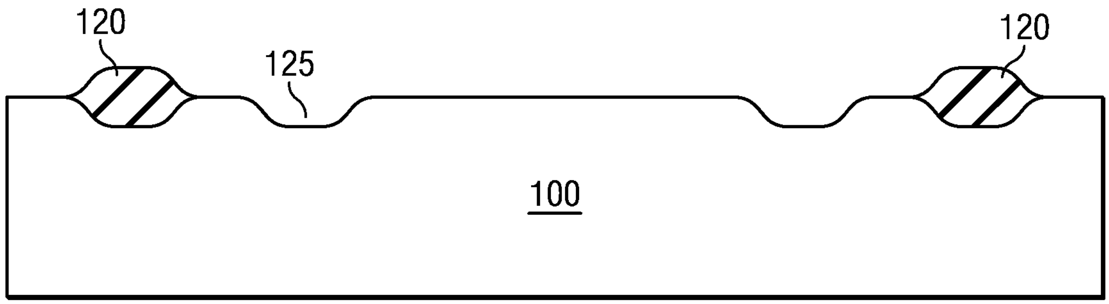
Figure 8C:
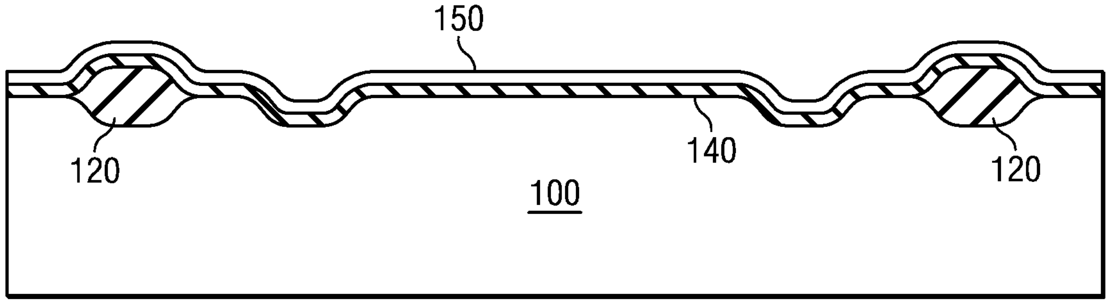

FIG. 8, which includes FIGS. 8A-8C, illustrates an embodiment of the invention of a MEMS device in various stages of processing, wherein a membrane layer of the MEMS device includes positive and negative corrugations.

Referring to FIG. 8A, oxide regions 120 are formed as described with respect to FIG. 2B. Similar to the embodiment of FIG. 6, the oxide regions 120 are removed. However, unlike the embodiment of FIG. 6, only some of the oxide regions 120 are removed in this embodiment (FIG. 8B). For example, a region of the MEMS device is covered, for example, by forming an etch mask, and some of the oxide regions 120 are removed leaving a plurality of trenches 125.

Referring to FIG. 8C, the plurality of trenches 125 and the remaining oxide regions 120 are covered with a first sacrificial liner 140 and a membrane layer 150 as described in prior embodiments. Subsequent processing following the embodiments discussed above with respect to FIG. 2, e.g., FIGS. 2F-2O. Thus, in this embodiment, the membrane layer 150 having both positive and negative corrugations may be formed.

FIG. 9, which includes FIGS. 9A-9E, illustrates cross-sectional views of a MEMS device during various stages of fabrication in accordance with another embodiment of the invention.

Unlike the prior embodiments, this embodiment forms corrugations having smooth edges by using an etch process.

Figure 9A:
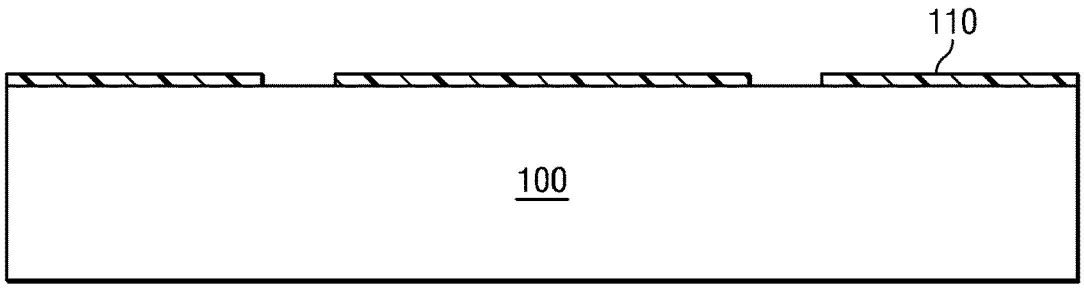
FIGS. 9A-9E, illustrates cross-sectional views of a MEMS device during various stages of fabrication in accordance with another embodiment of the invention.

Referring to FIG. 9A, a masking layer 110 is formed over a substrate 100 as in other embodiments (e.g., FIG. 2A). However, in this embodiment, a plurality of trenches 125 is formed without oxidization. Rather, in this embodiment, an etching technique is used.

Figure 9B:
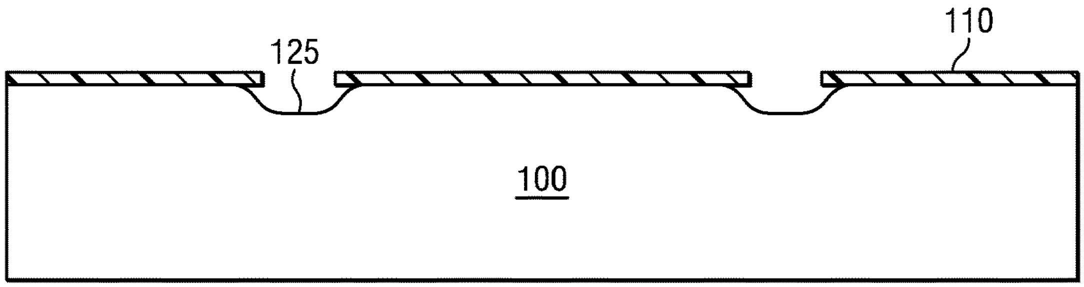

As illustrated in FIG. 9B, in one or more embodiments, an isotropic etching is used to form the plurality of trenches 125. The depth of the plurality of trenches 125 is adjusted by the etching time in one embodiment. Therefore, this process may be susceptible to more variations. Accordingly, in one embodiment, the surface of the substrate 100 may be doped to reduce the etch rate, which may help to reduce variations. Similarly, the etching chemistry may be selected to reduce variations and improve control of the process as known to one skilled in the art.

Figure 9C:
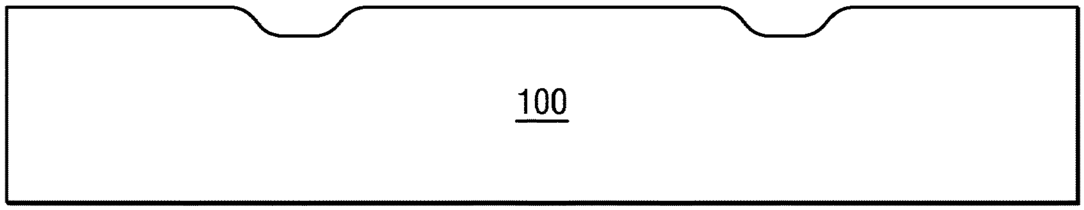
Figure 9D:
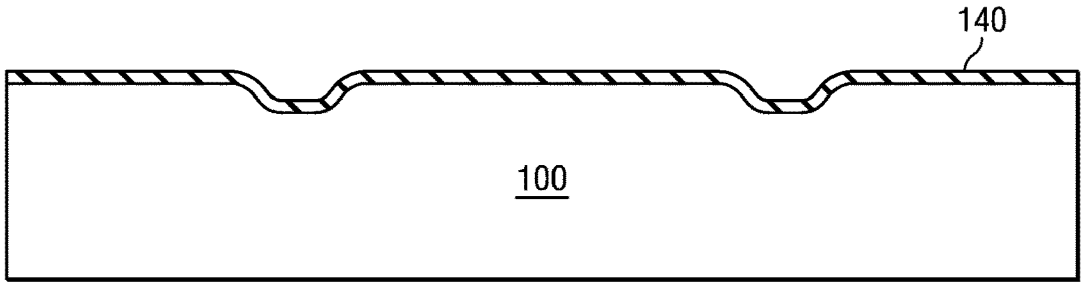
Figure 9E:
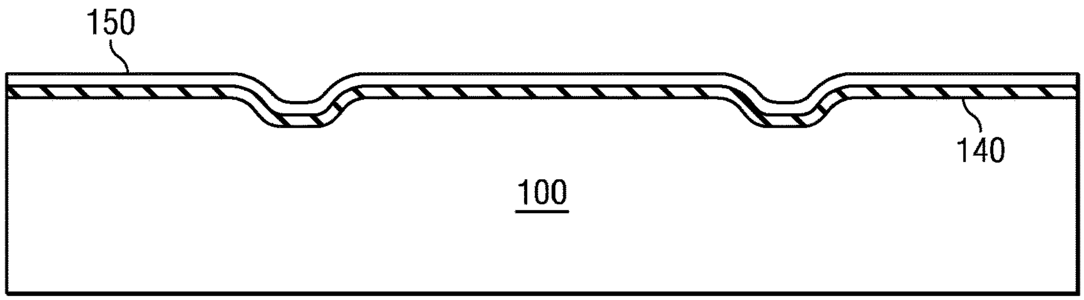

The masking layer 110 is removed as illustrated in FIG. 9C. Referring to FIG. 9D, a first sacrificial liner 140 is formed over the substrate 100 and the plurality of trenches 125. A membrane layer 150 is formed over the first sacrificial liner 140 as described in prior embodiments (FIG. 9E). Subsequent processing follows as described in the embodiment following FIGS. 2F-2O.

FIG. 10, which includes FIGS. 10A-10G, illustrates cross-sectional views of a MEMS device during various stages of fabrication in accordance with another embodiment of the invention.

Unlike the prior embodiment of FIG. 9, this embodiment forms corrugations using an additional insulating layer.

Figure 10A:
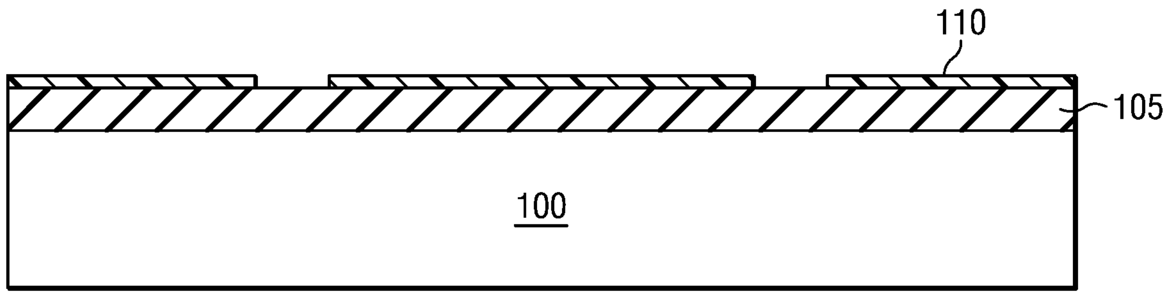
FIGS. 10A-10G, illustrates cross-sectional views of a MEMS device during various stages of fabrication in accordance with another embodiment of the invention.

Referring to FIG. 10A, a masking layer no is formed as in other embodiments (e.g., FIG. 2A). However, unlike the prior embodiments, the masking layer 110 is formed over an additional insulating layer 105. The additional insulating layer 105 may be deposited over the substrate 100. The additional insulating layer 105 may comprise an oxide in one embodiment, whereas in some embodiments, the additional insulating layer 105 may comprise other materials such as nitrides.

Figure 10B:
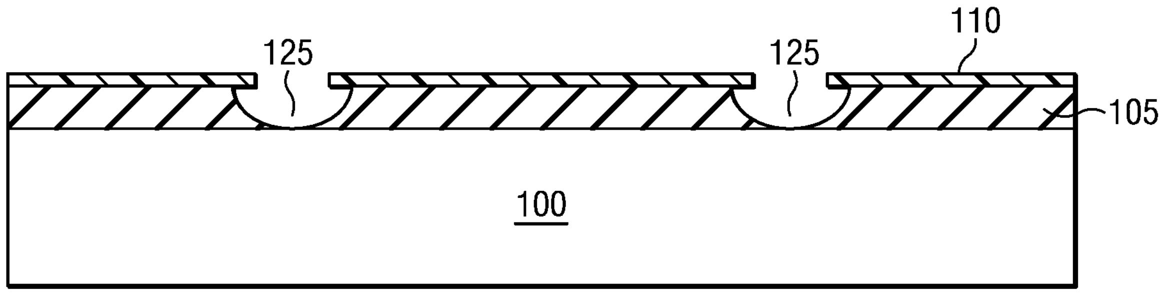

As next illustrated in FIG. 10B, in one or more embodiments, an isotropic etching is used to form the plurality of trenches 125. The depth of the plurality of trenches 125 is adjusted by the thickness of the additional insulating layer 105. Therefore, this process may be susceptible to less process variation relative to the embodiment of FIG. 9.

Figure 10C:
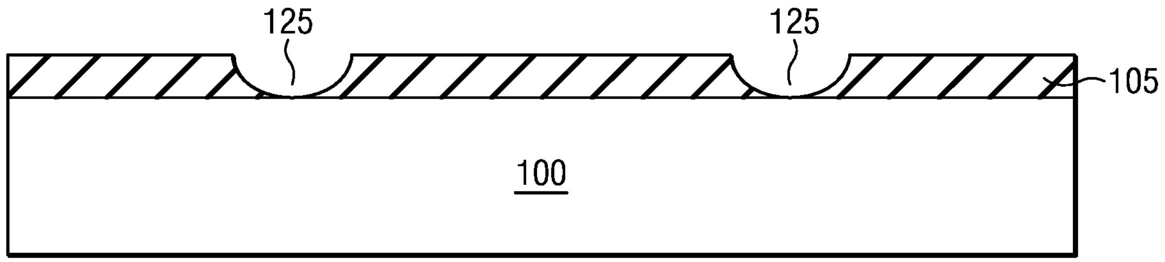
Figure 10D:
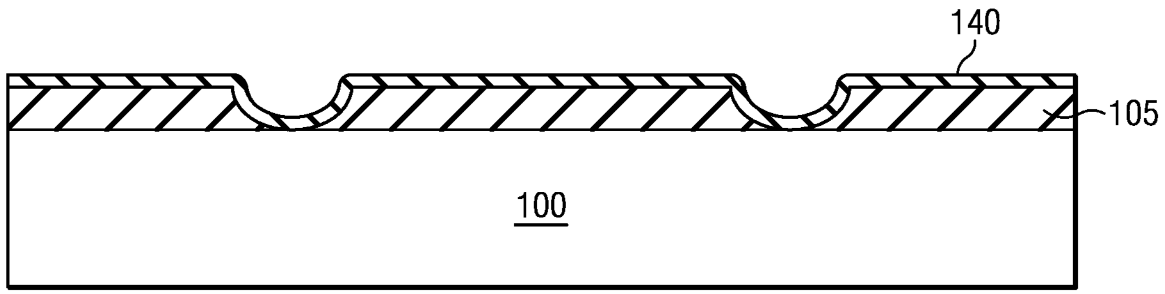
Figure 10E:
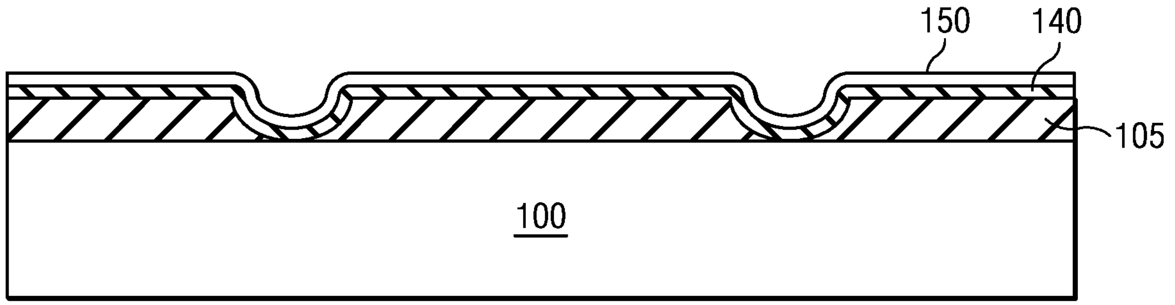
Figure 10F:
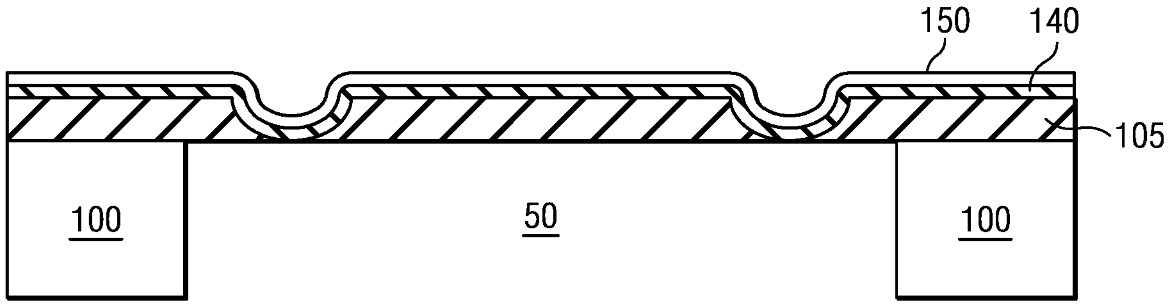
Figure 10G:
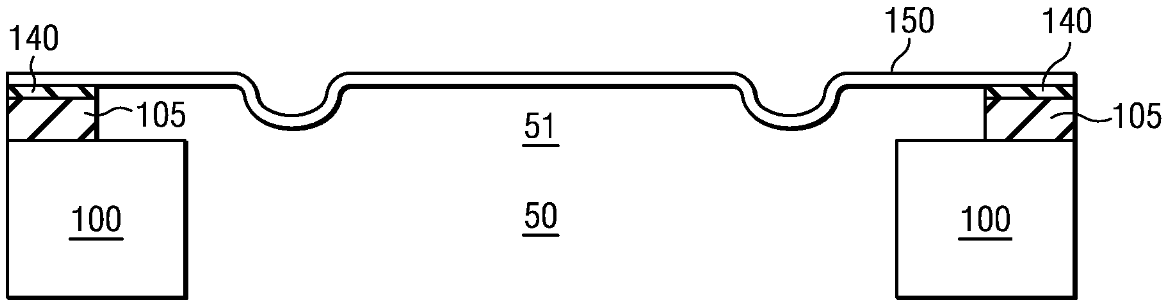

The masking layer no is removed as illustrated in FIG. 10C. Referring to FIG. 10D, a first sacrificial liner 140 is formed over the substrate 100 and the plurality of trenches 125. A membrane layer 150 is formed over the first sacrificial liner 140 as described in prior embodiments (FIG. 10E). Subsequent processing follows as described in the embodiment following FIGS. 2F-2O. For example, as illustrated in FIG. 10F, the cavity 50 is formed from the back side of the substrate 100. After forming the cavity 50, as illustrated in FIG. 10G, an additional etch may be performed to remove the additional insulating layer 105 and the first sacrificial liner 140. If the additional insulating layer 105 and the first sacrificial liner 140 comprise a same material, a single etch may be used to remove both the layers.

Figure 11A:
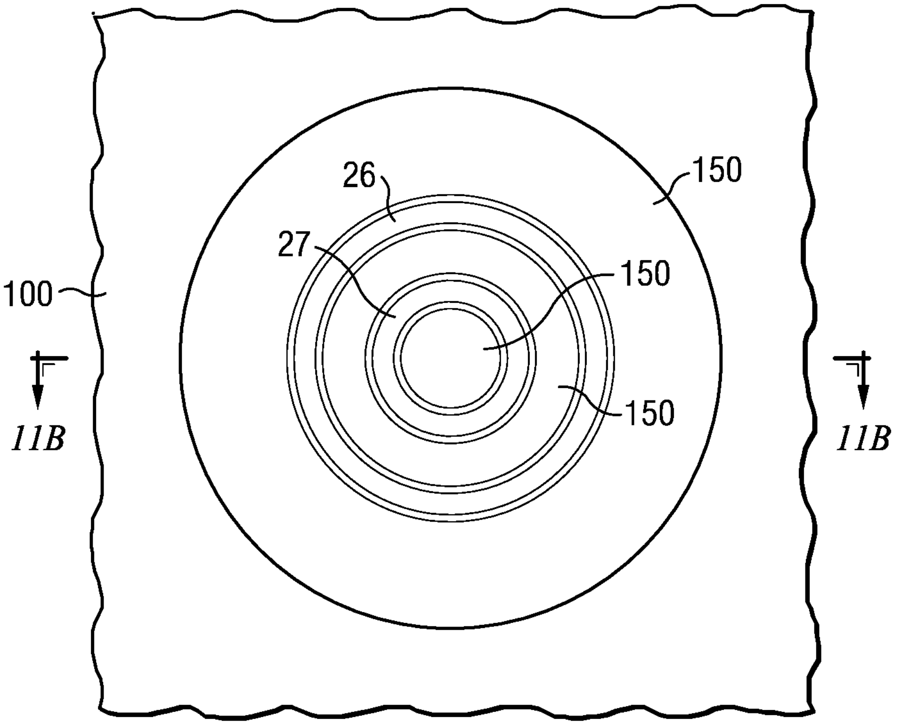
Figure 11B:
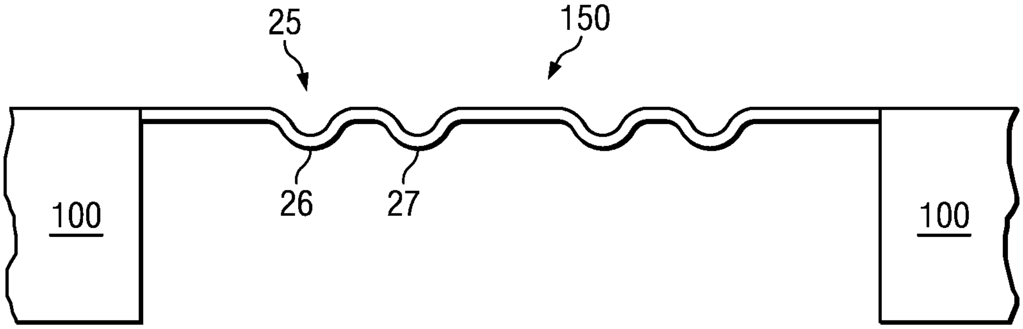

FIG. 11, which includes FIGS. 11A and 11B, illustrates a MEMS device having a circular membrane in accordance with an embodiment of the invention, wherein FIG. 11A illustrates a top view and FIG. 11B illustrates a cross-sectional view.

Referring to FIGS. 11A and 11B, the membrane layer 150 is formed over the substrate 100 and includes corrugations 25. Unlike the prior embodiments, the corrugations 25 comprise a first corrugation 26 separated from a second corrugation 27 by a flat region of the membrane layer 150.

Figure 12A:
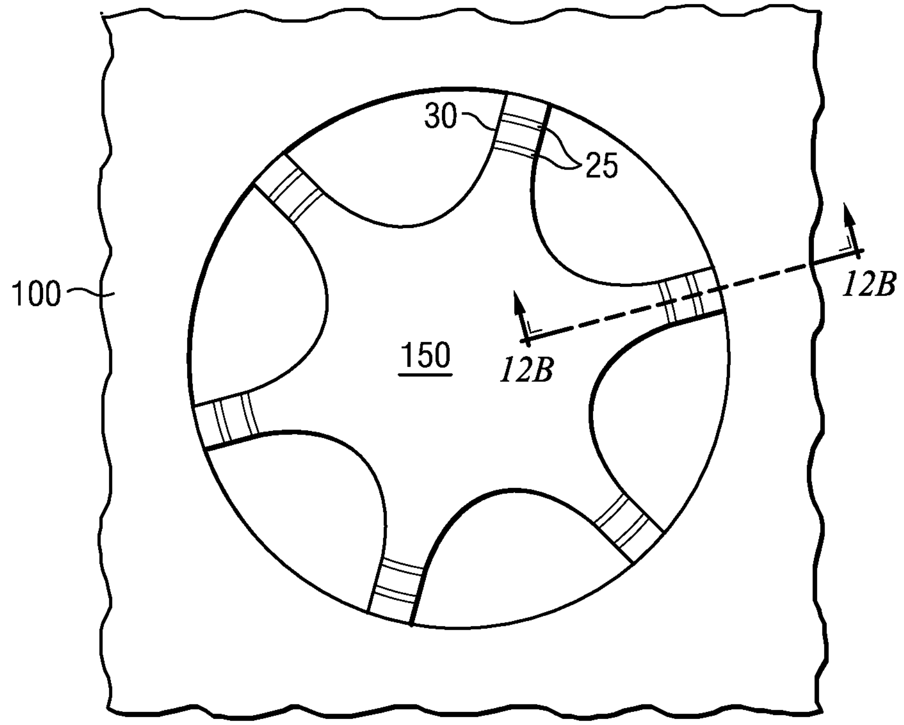
Figure 12B:
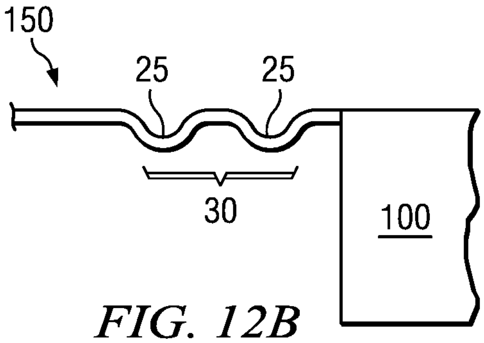

FIG. 12, which includes FIGS. 12A and 12B, illustrates a MEMS device having a spring supported membrane in accordance with an embodiment of the invention, wherein FIG. 12A illustrates a top view and FIG. 12B illustrates a cross-sectional view.

Referring to FIGS. 12A and 12B, the membrane layer 150 is formed over the substrate 100 and includes corrugations 25. However, in this embodiment, a central portion of the membrane layer 150 is supported by a plurality of support structures 30. The plurality of support structures 30 comprise corrugations 25 as described in various embodiments.

Figure 13:
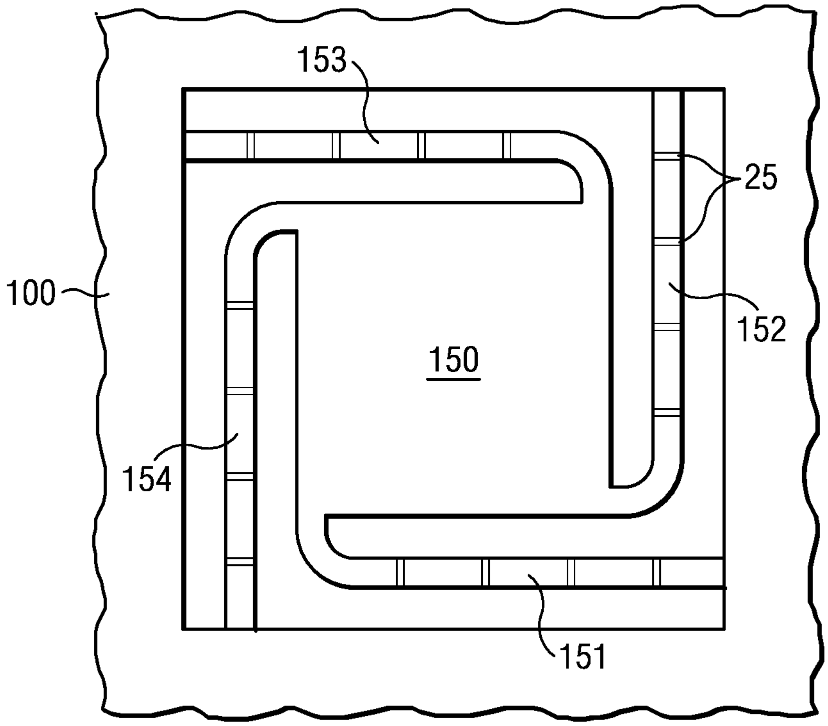
FIG. 13 illustrates a top view of a MEMS device having a spring supported membrane in accordance with an alternative embodiment of the invention.

FIG. 13 illustrates a top view of a MEMS device having a spring supported membrane in accordance with an alternative embodiment of the invention.

Similar to the embodiment of FIG. 12, a plurality of support structures 30 support the membrane layer 150 to the substrate 100. In this embodiment, the plurality of support structures 30 comprises a first support 151, a second support 152, a third support 153, and a fourth support 154. Each support of the plurality of support structures 30 is oriented orthogonally to an adjacent support in one embodiment, as illustrated in FIG. 13. Each support of the plurality of support structures 30 comprise corrugations 25 as described in various embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
- applying a structured masking layer to a substrate;
- forming a plurality of features in the substrate using the structured masking layer, wherein the plurality of features comprises a plurality of trenches formed by isotropic etching;
- removing the structured masking layer;
- after removing the structured masking layer, forming a spring supported membrane layer over the substrate comprising the plurality of features; and
- removing a portion of the substrate under the membrane layer.

2. The method of claim 1, wherein forming the membrane layer comprises depositing a poly silicon layer.

3. The method of claim 1, further comprising:
- before forming the plurality of features, depositing a masking layer, wherein the masking layer comprises a stack comprising $SiO_2$/SiN, $SiO_2$/Poly Silicon/SiN, or $SiO_2$/amorphous silicon/SiN; and
- patterning the masking layer to form the structured masking layer.

4. The method of claim 1, further comprising:
- depositing a liner over the plurality of features before forming the membrane layer.

5. The method of claim 1, further comprising depositing a liner directly over the entire substrate and the plurality of features before forming the membrane layer.

6. The method of claim 1, wherein the membrane layer is supported by a plurality of support structures, the plurality of support structures comprising a first support and a second support oriented orthogonally to the first support.

7. The method of claim 6, wherein the first support comprises corrugations.

8. The method of claim 1, wherein the membrane layer comprises a star-like configuration in top view.

9. The method of claim 8, wherein the star-like configuration comprises 6 arms extending from an inner region of the membrane layer to an outer region of the membrane layer, and wherein trenches of the plurality of trenches are only located in the arms.

10. The method of claim 1, further comprising:
- forming a plurality of bumps over the membrane layer; and
- forming a back plate layer over the plurality of bumps.

11. The method of claim 10, further comprising:
- forming a first contact to the substrate;
- forming a second contact to the back plate layer; and
- forming a third contact to the membrane layer.

12. The method of claim 10, wherein forming the back plate layer comprises depositing a layer comprising silicon.

13. The method of claim 10, further comprising:

before forming the plurality of bumps, forming a sacrificial layer over the membrane layer, the sacrificial layer having bump holes;

forming the plurality of bumps by depositing a bump liner over the sacrificial layer; and removing the sacrificial layer between the membrane layer and the back plate layer.

14. A method of manufacturing a semiconductor device, the method comprising:

forming a membrane layer comprising a plurality of corrugations over a substrate, each corrugation of the plurality of corrugations having a sidewall, a top surface, and a bottom surface, wherein a radius of curvature of an edge connecting the sidewall and the bottom surface is greater than a thickness of the membrane layer, and wherein a radius of curvature of an edge connecting the sidewall and the top surface is greater than the thickness of the membrane layer; and forming a cavity in the substrate under the membrane layer, wherein the membrane layer comprises a spring supported membrane.

15. The method of claim 14, wherein a radius of curvature of an edge connecting the sidewall and the bottom surface is greater than about 100 nm, and wherein a radius of curvature of an edge connecting the sidewall to a top surface is greater than about 100 nm, wherein the top surface is opposite to the bottom surface separated by the sidewall.

16. The method of claim 14, wherein the membrane layer comprises a circular membrane.

17. The method of claim 14, wherein the radius of curvature of the edge connecting the sidewall and the bottom surface is greater by an order of magnitude than the thickness of the membrane layer.

18. The method of claim 14, further comprising:

forming a plurality of bumps over the membrane layer; and forming a back plate layer over the plurality of bumps, wherein the membrane layer comprises poly silicon.

19. The method of claim 18, further comprising:

forming a first gap between the plurality of bumps and the membrane layer; and forming a second gap under the membrane layer so that a central portion of the membrane layer is moveable.

20. The method of claim 19, wherein the central portion of the membrane layer is configured to move up into the first gap towards the plurality of bumps and down into the second gap towards the substrate.

* * * * *